(12) United States Patent
Meyer-Berg et al.

(10) Patent No.: US 9,425,116 B2
(45) Date of Patent: Aug. 23, 2016

(54) INTEGRATED CIRCUIT PACKAGE AND A METHOD FOR MANUFACTURING AN INTEGRATED CIRCUIT PACKAGE

(71) Applicant: Infineon Technologies AG, Neubiberg (DE)

(72) Inventors: Georg Meyer-Berg, Munich (DE); Frank Daeche, Unterhaching (DE)

(73) Assignee: INFINEON TECHNOLOGIES AG, Neubiberg (DE)

(*) Notice: Subject to any disclaimer, the term of this patent is extended or adjusted under 35 U.S.C. 154(b) by 223 days.

(21) Appl. No.: 13/656,822

(22) Filed: Oct. 22, 2012

(65) Prior Publication Data

US 2013/0082386 A1 Apr. 4, 2013

Related U.S. Application Data

(63) Continuation-in-part of application No. 13/326,527, filed on Dec. 15, 2011, now Pat. No. 9,105,562, which is a continuation-in-part of application No. 13/103,124, filed on May 9, 2011, now Pat. No. 9,269,685.

(51) Int. Cl.
*H01L 23/12* (2006.01)
*H01L 21/52* (2006.01)
(Continued)

(52) U.S. Cl.
CPC ............. *H01L 23/12* (2013.01); *H01L 21/52* (2013.01); *H01L 23/13* (2013.01); *H01L 23/49822* (2013.01); *H01L 23/49827* (2013.01); *H01L 23/50* (2013.01); *H01L 23/5389* (2013.01);

(Continued)

(58) Field of Classification Search
CPC combination set(s) only.
See application file for complete search history.

(56) References Cited

U.S. PATENT DOCUMENTS 4,477,828 A 10/1984 Scherer
6,075,712 A * 6/2000 McMahon ............ H01L 23/481
174/255

(Continued)

FOREIGN PATENT DOCUMENTS

CN 101536181 A 9/2009
CN 102779808 A 11/2012
(Continued)

OTHER PUBLICATIONS

Office Action issued in the corresponding DE Application No. 102012112328.4, mailed on Nov. 13, 2013, 7 pages.
(Continued)

*Primary Examiner* — Mohammad Islam
*Assistant Examiner* — Ratisha Mehta

(57) ABSTRACT

An integrated circuit package includes a package module including one or more circuit interconnections formed in a carrier, wherein at least one top-side package contact is formed over the top-side of the package module and electrically connected to at least one circuit interconnection of the one or more circuit interconnections and wherein a cavity is formed at the top-side of the package module; a chip disposed in the cavity, the chip including at least one chip front side contact and at least one chip back side contact, wherein the at least one chip front side contact is electrically connected to at least one further circuit interconnection of the one or more circuit interconnections; an electrically conductive structure connecting the at least one top-side package contact to the chip back side contact; and a metallic layer formed over the electrically conductive structure and on the chip back side contact.

14 Claims, 19 Drawing Sheets

(51) Int. Cl.
  *H01L 23/50* (2006.01)
  *H01L 23/13* (2006.01)
  *H05K 1/18* (2006.01)
  *H01L 23/538* (2006.01)
  H01L 23/498 (2006.01)
  H01L 23/00 (2006.01)
  H01L 25/065 (2006.01)
  H05K 3/46 (2006.01)

(52) U.S. Cl.
  CPC ............... *H01L 24/24* (2013.01); *H01L 24/82* (2013.01); *H05K 1/186* (2013.01); *H01L 23/49816* (2013.01); *H01L 24/06* (2013.01); *H01L 24/16* (2013.01); *H01L 24/73* (2013.01); *H01L 25/0655* (2013.01); *H01L 2224/0401* (2013.01); *H01L 2224/06181* (2013.01); *H01L 2224/131* (2013.01); *H01L 2224/16238* (2013.01); *H01L 2224/24101* (2013.01); *H01L 2224/24227* (2013.01); *H01L 2224/73267* (2013.01); *H01L 2224/82106* (2013.01); *H01L 2924/014* (2013.01); *H01L 2924/01029* (2013.01); *H01L 2924/01322* (2013.01); *H01L 2924/12042* (2013.01); *H01L 2924/13055* (2013.01); *H01L 2924/1431* (2013.01); *H01L 2924/15153* (2013.01); *H01L 2924/15311* (2013.01); *H05K 3/4697* (2013.01)

(56) References Cited

U.S. PATENT DOCUMENTS

| | | |
|---|---|---|
| 6,350,954 B1 | 2/2002 | Specks et al. |
| 7,323,766 B2 | 1/2008 | Weiblen et al. |
| 8,536,691 B2 | 9/2013 | Kikuchi et al. |
| 2001/0001989 A1 | 5/2001 | Smith |
| 2005/0101161 A1 | 5/2005 | Weiblen et al. |
| 2005/0127489 A1 | 6/2005 | Mallik et al. |
| 2007/0025092 A1 | 2/2007 | Lee et al. |
| 2007/0085201 A1 | 4/2007 | Bauer et al. |
| 2008/0116564 A1* | 5/2008 | Yang ................... H01L 23/5389 257/698 |
| 2008/0186690 A1 | 8/2008 | Miettinen et al. |
| 2008/0205008 A1 | 8/2008 | Sun et al. |
| 2009/0020882 A1* | 1/2009 | Hasegawa ............. H01L 21/481 257/773 |
| 2009/0283895 A1 | 11/2009 | Kikuchi et al. |
| 2010/0081236 A1 | 4/2010 | Yang et al. |
| 2010/0123241 A1 | 5/2010 | Shi et al. |
| 2010/0140779 A1 | 6/2010 | Lin et al. |
| 2010/0187676 A1 | 7/2010 | Suh et al. |
| 2011/0115060 A1* | 5/2011 | Chiu ..................... H01L 21/568 257/660 |
| 2011/0260336 A1 | 10/2011 | Kang et al. |
| 2012/0146177 A1 | 6/2012 | Choi et al. |
| 2012/0286413 A1 | 11/2012 | Meyer-Berg et al. |

FOREIGN PATENT DOCUMENTS

| | | |
|---|---|---|
| DE | 10352002 A1 | 6/2005 |
| JP | 08335650 A | 12/1996 |
| JP | 2004087700 A | 3/2004 |

OTHER PUBLICATIONS

Office Action issued in the corresponding DE Application No. 102012112327.6, mailed on Nov. 13, 2013, 10 pages.

Office Action received for U.S. Appl. No. 13/103,124, dated Sep. 8, 2014, 16 pages.

Office Action received for U.S. Appl. No. 13/326,527, dated Aug. 20, 2014, 6 pages.

* cited by examiner

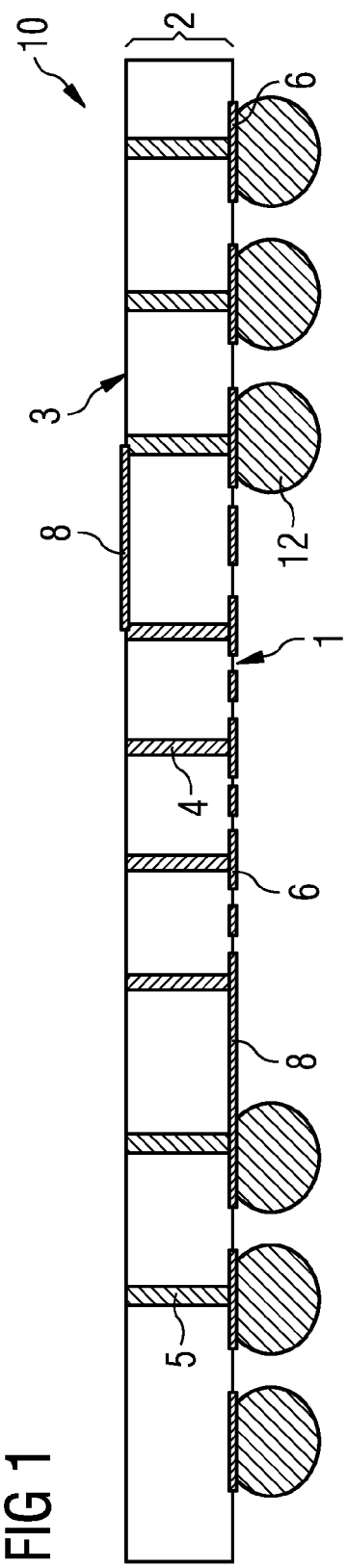
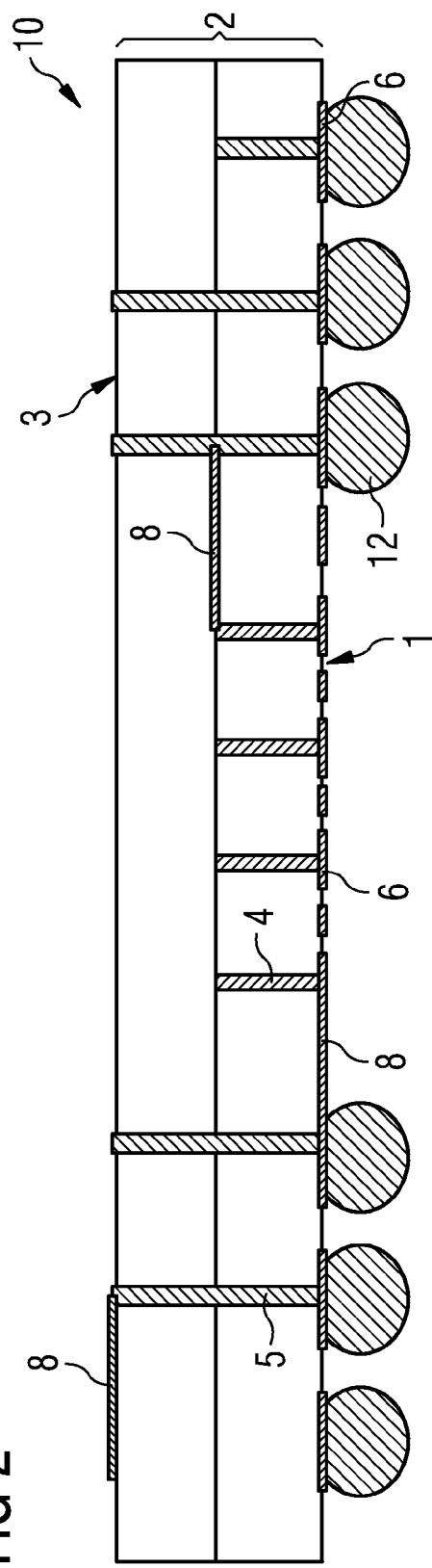

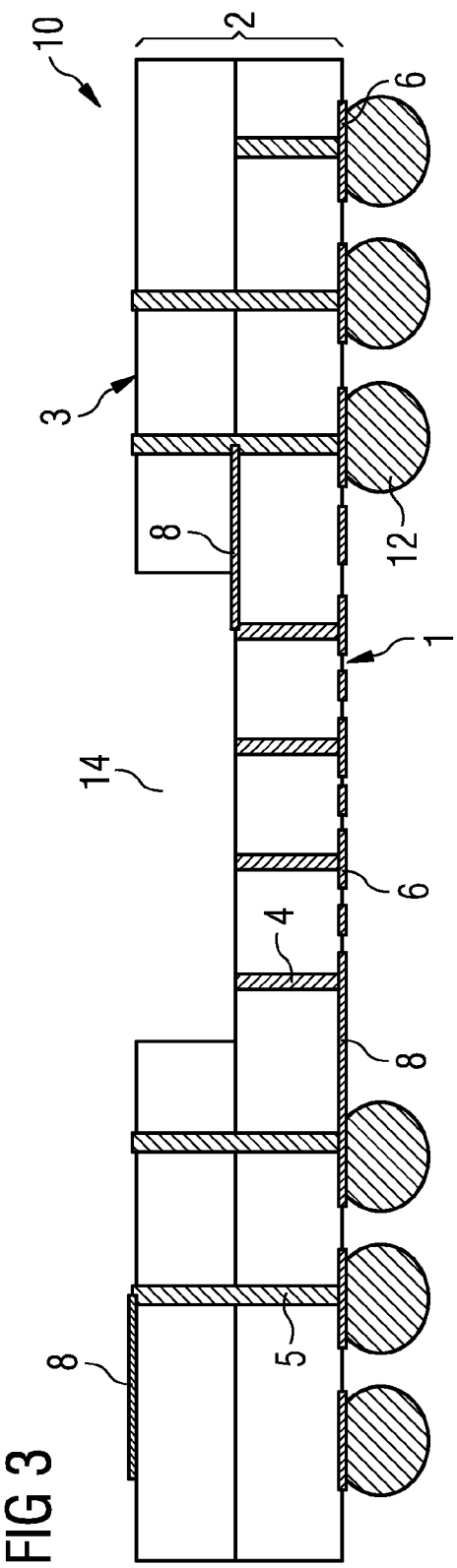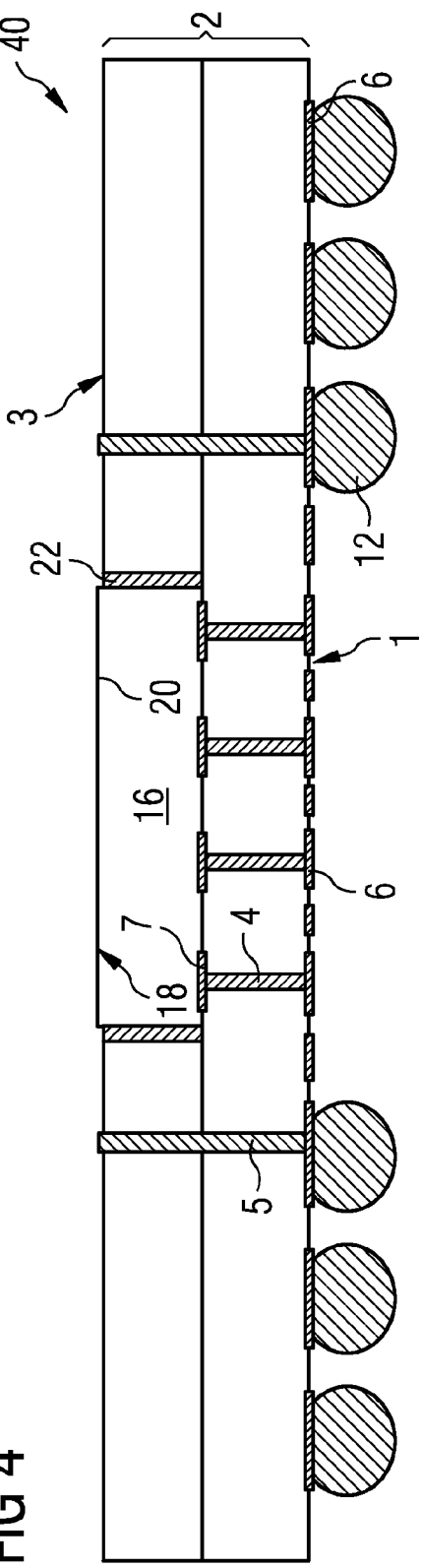

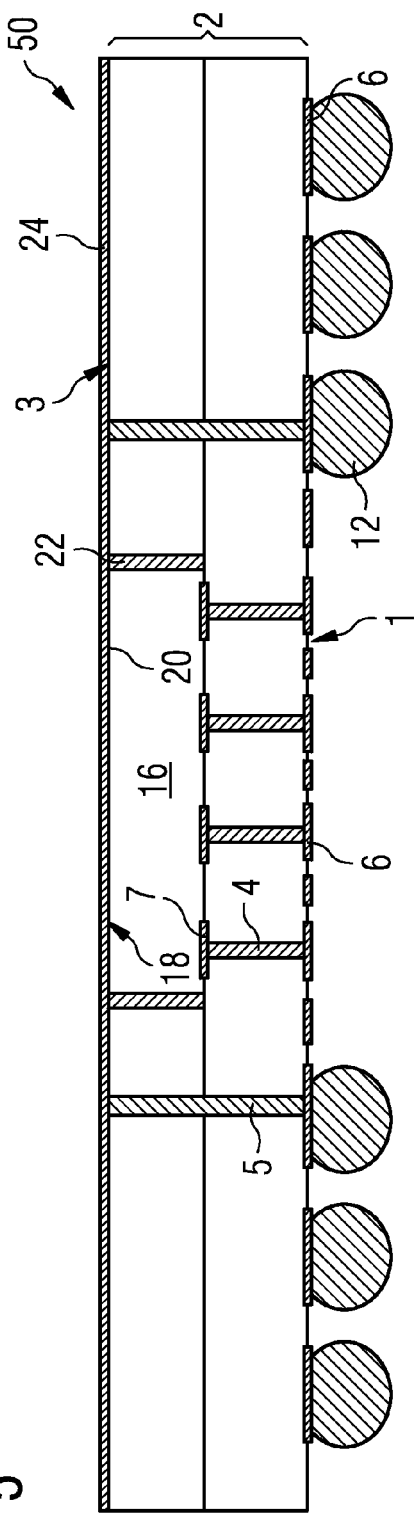
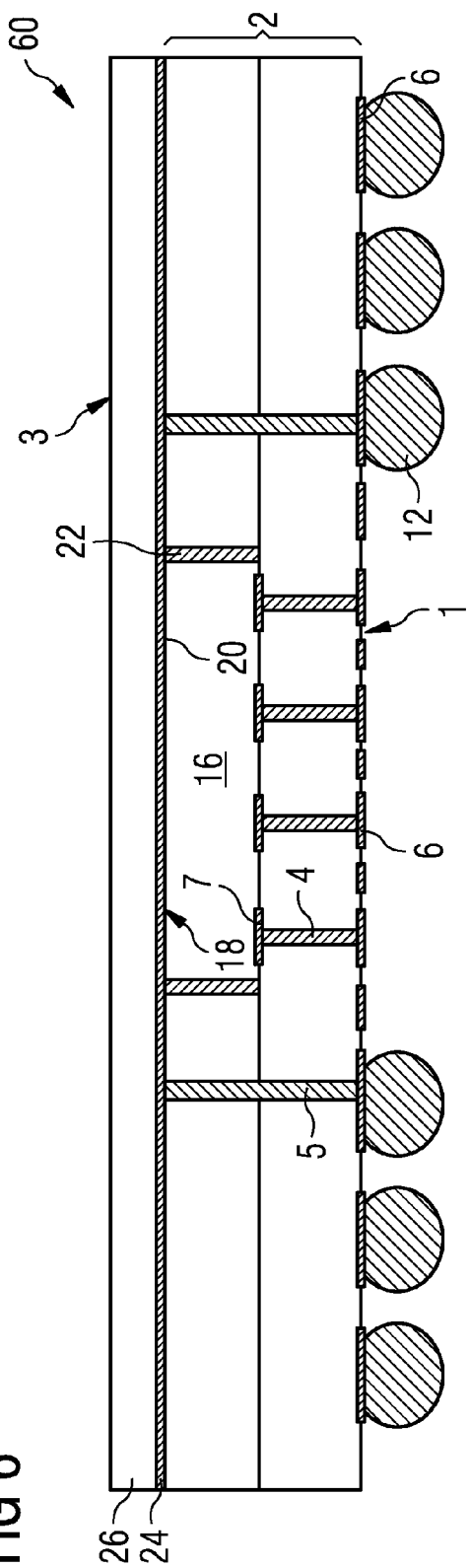

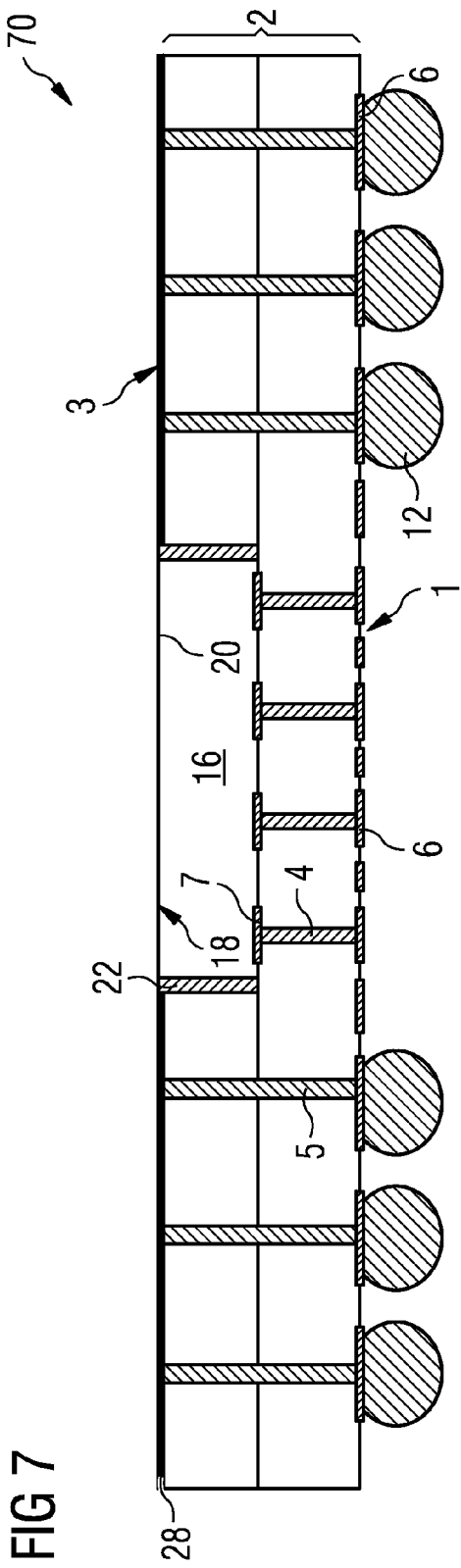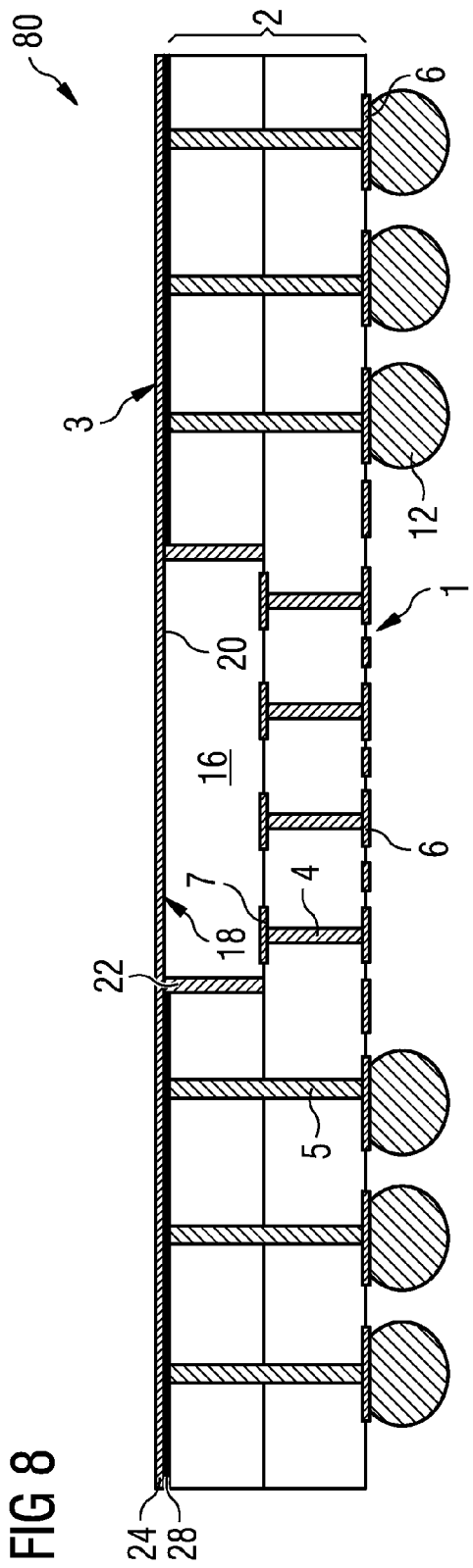

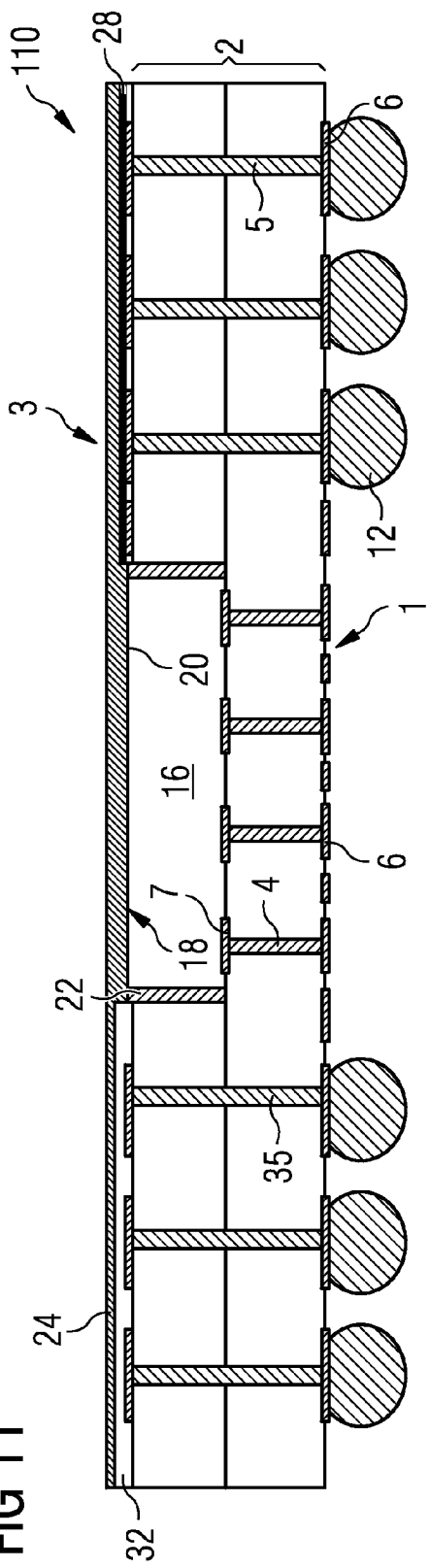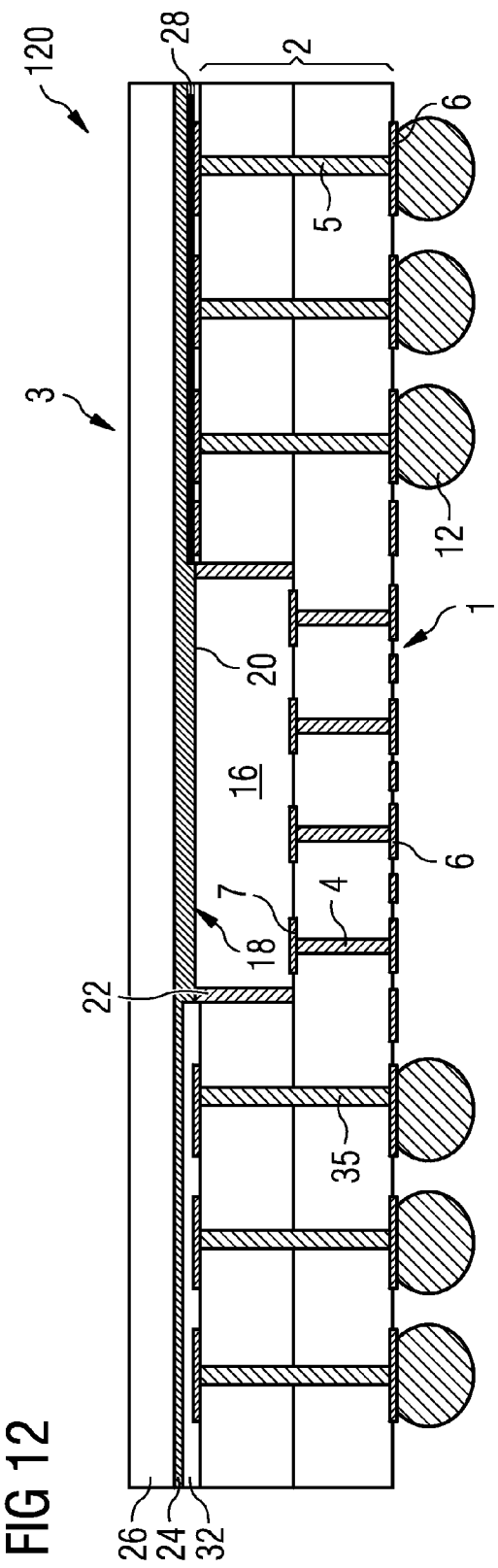

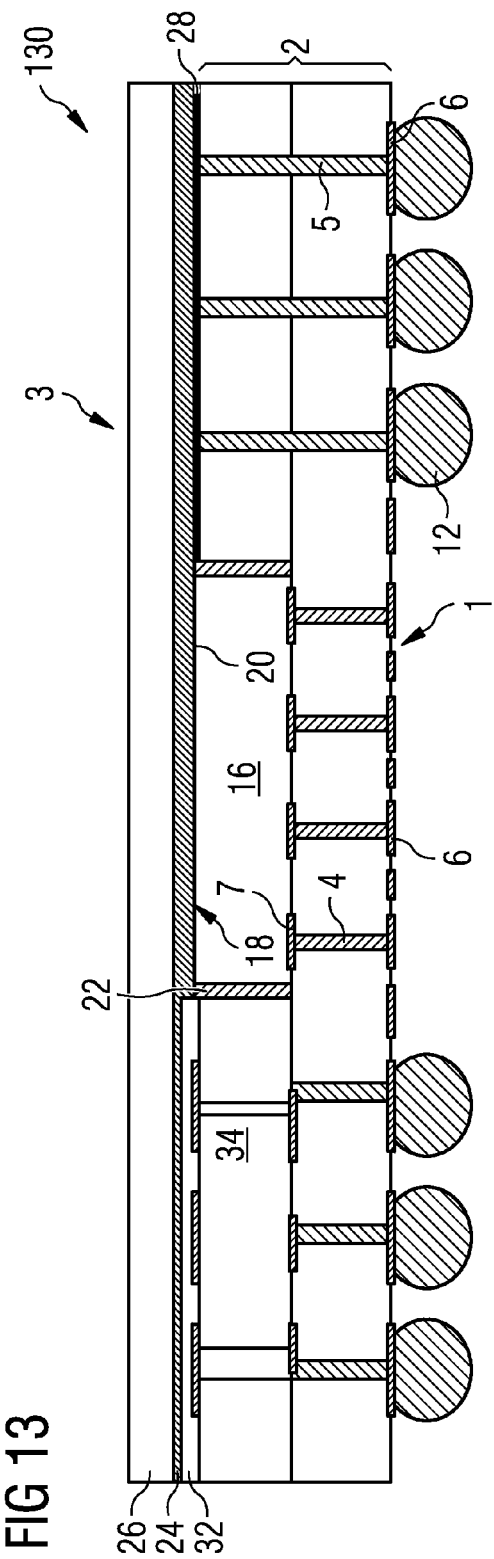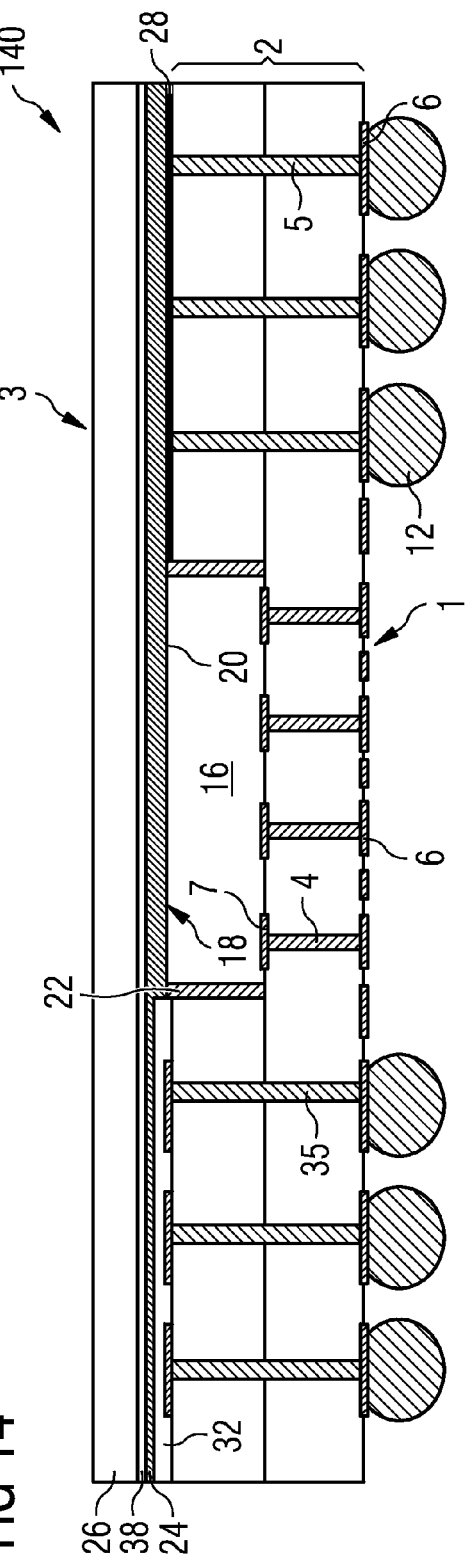

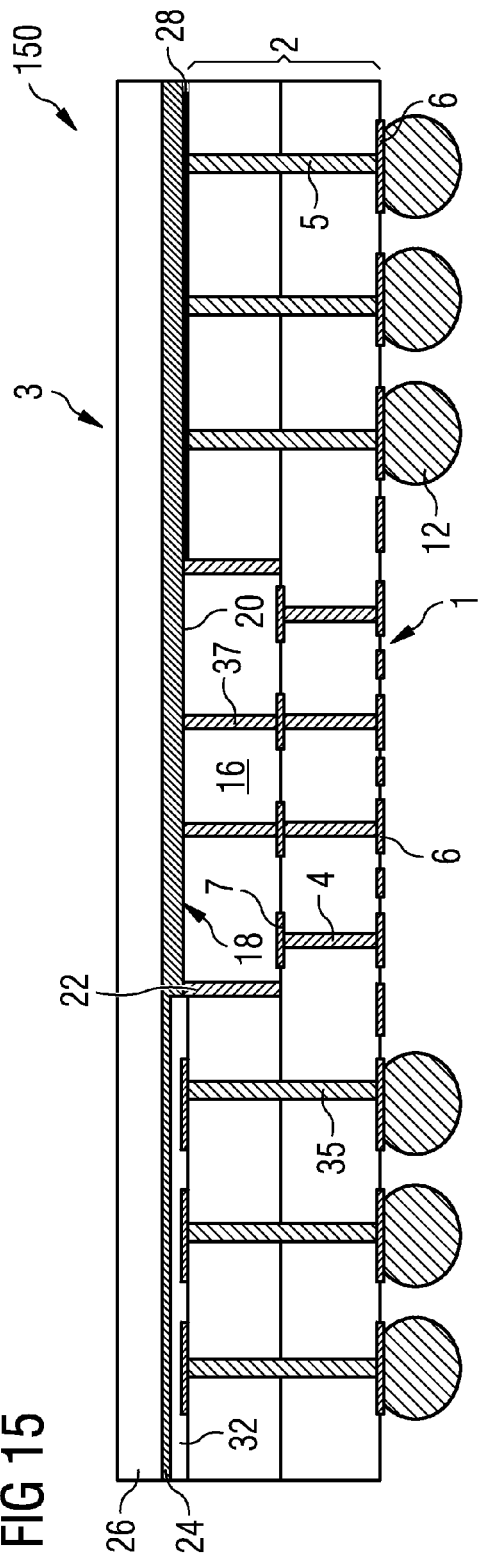
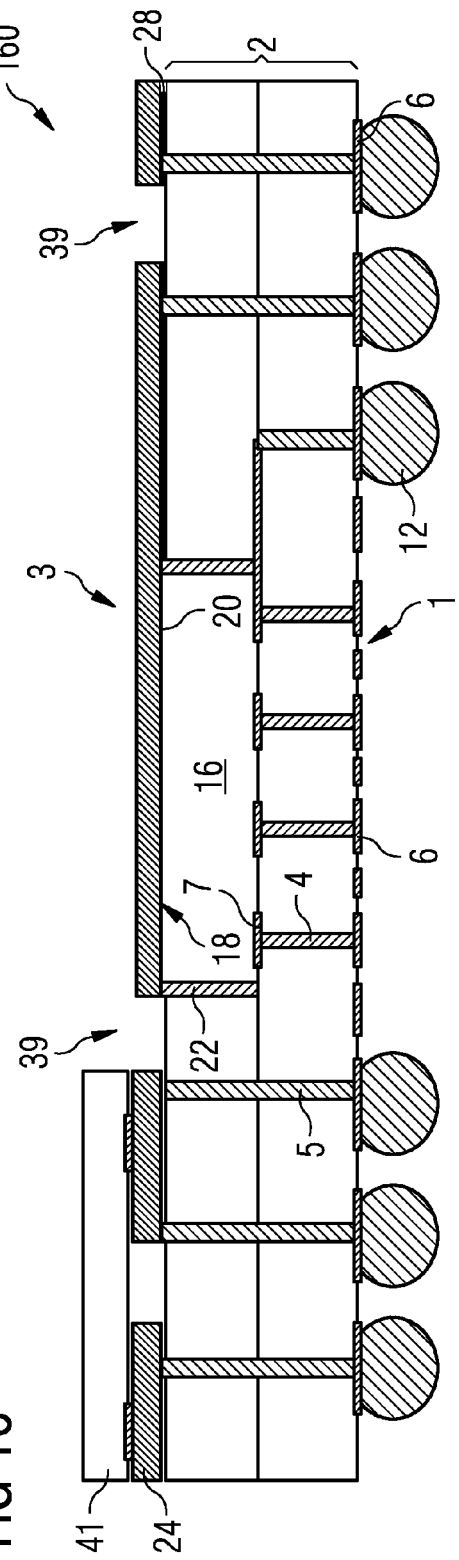

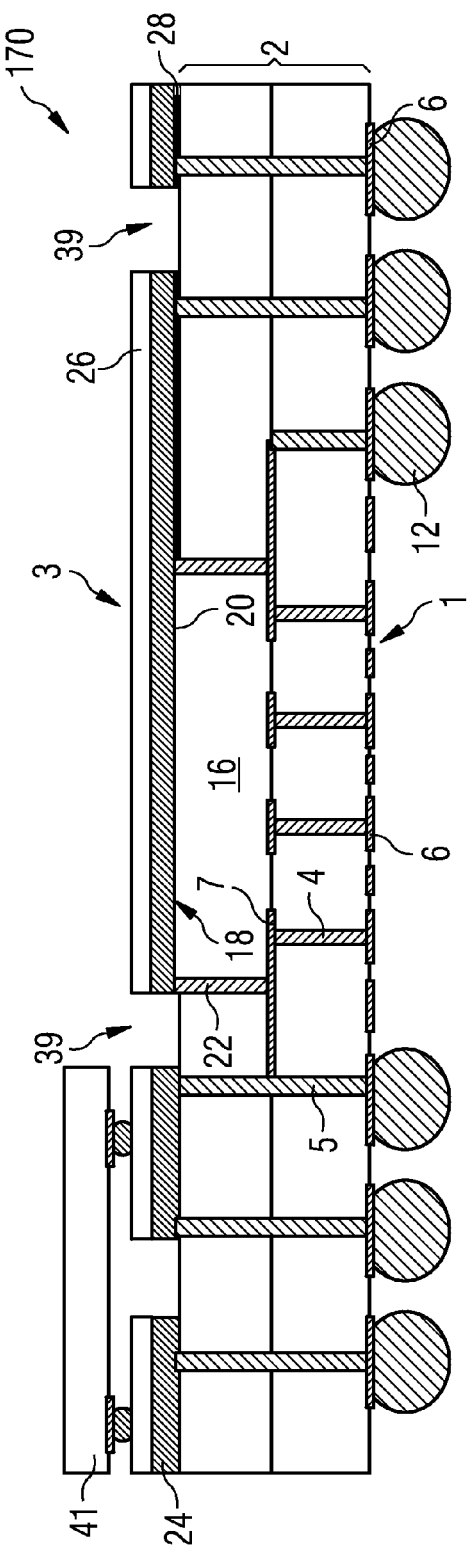
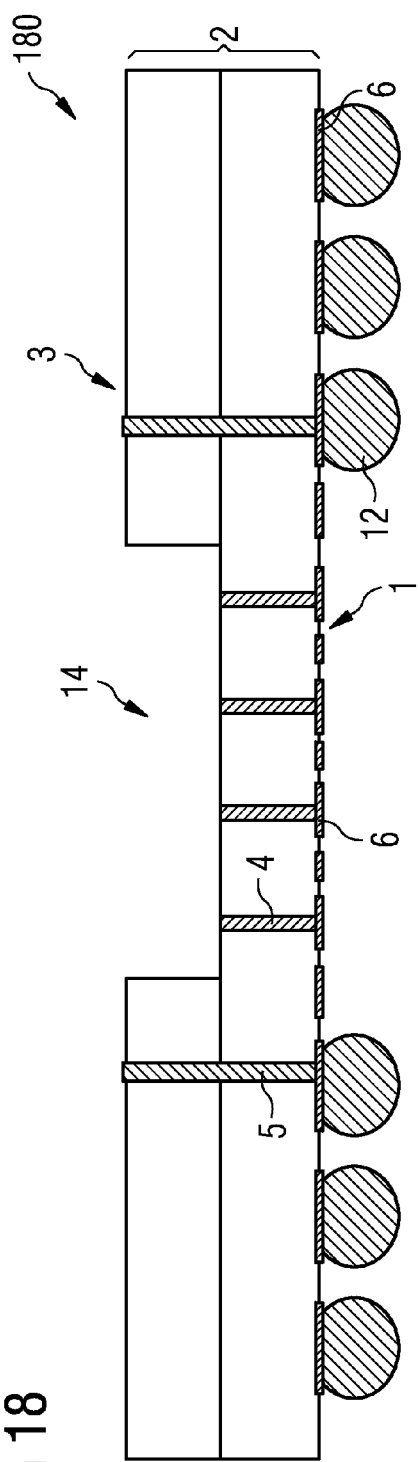
FIG 17
FIG 18

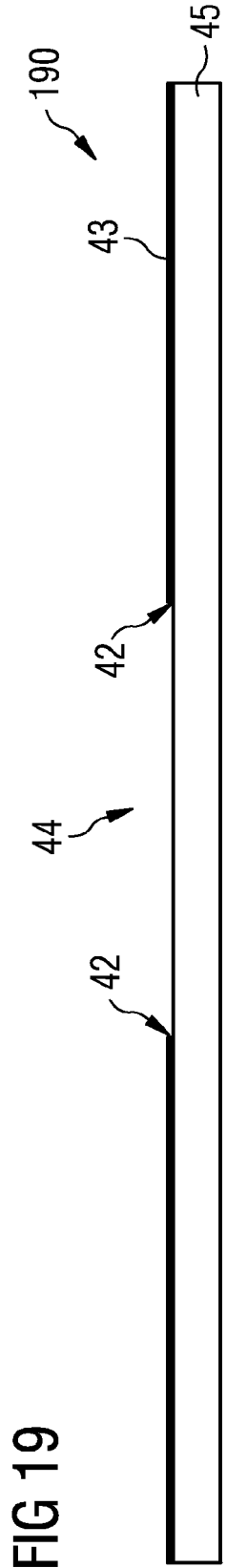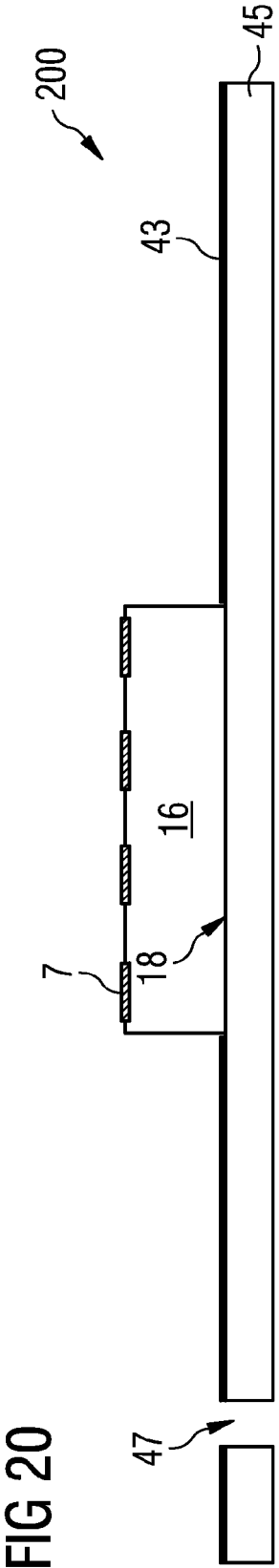

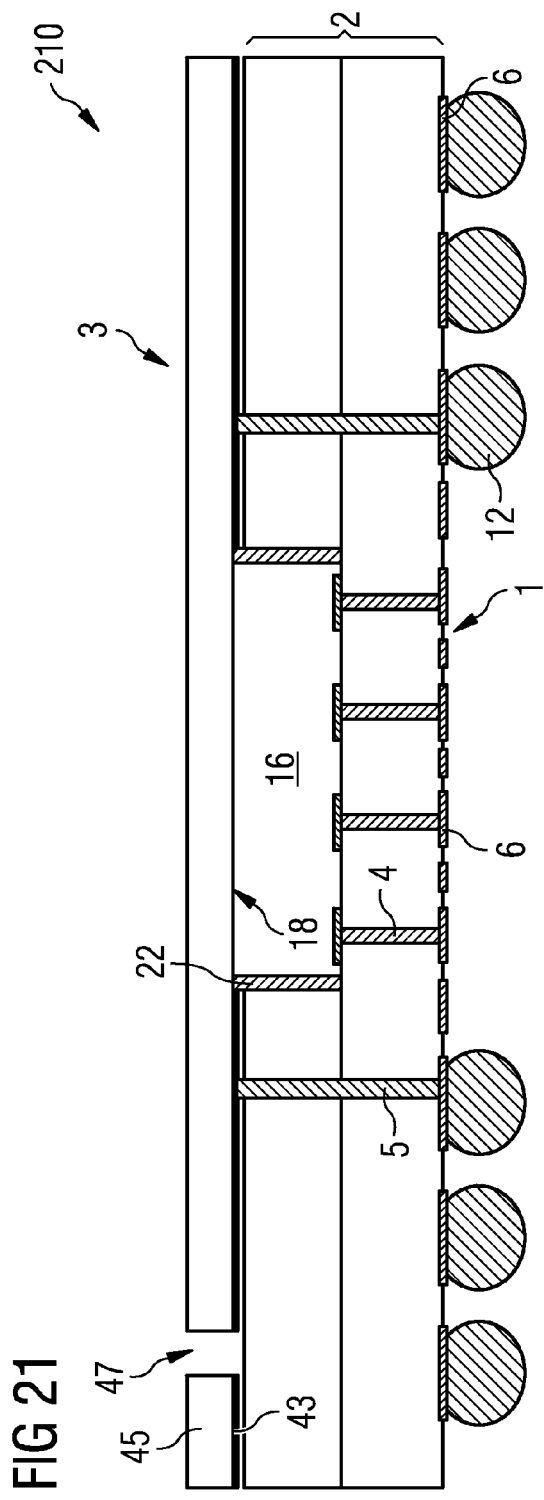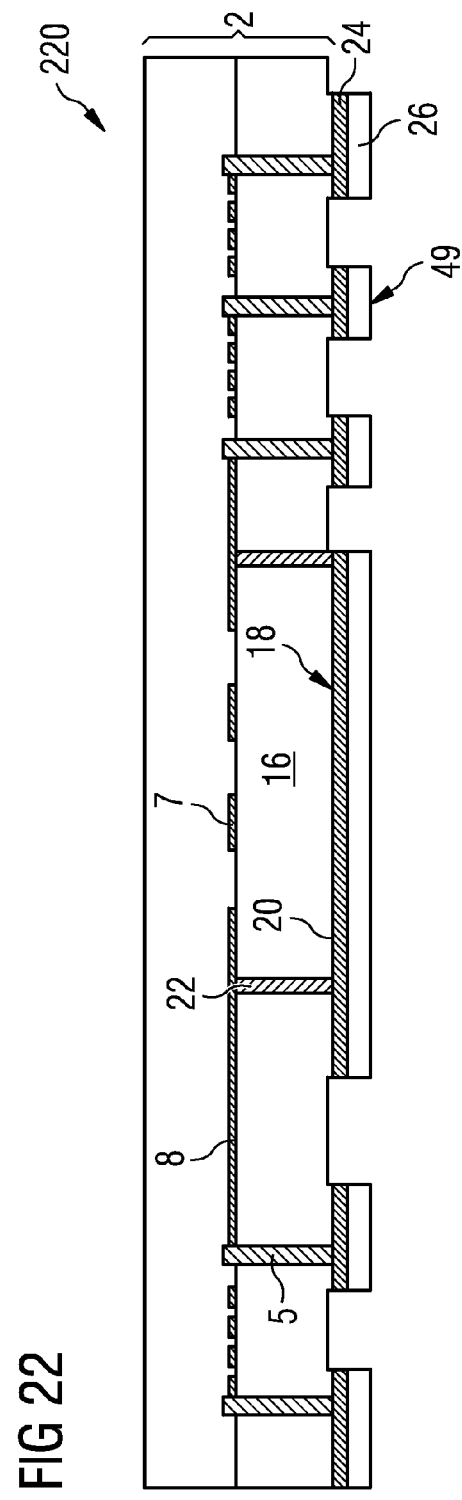

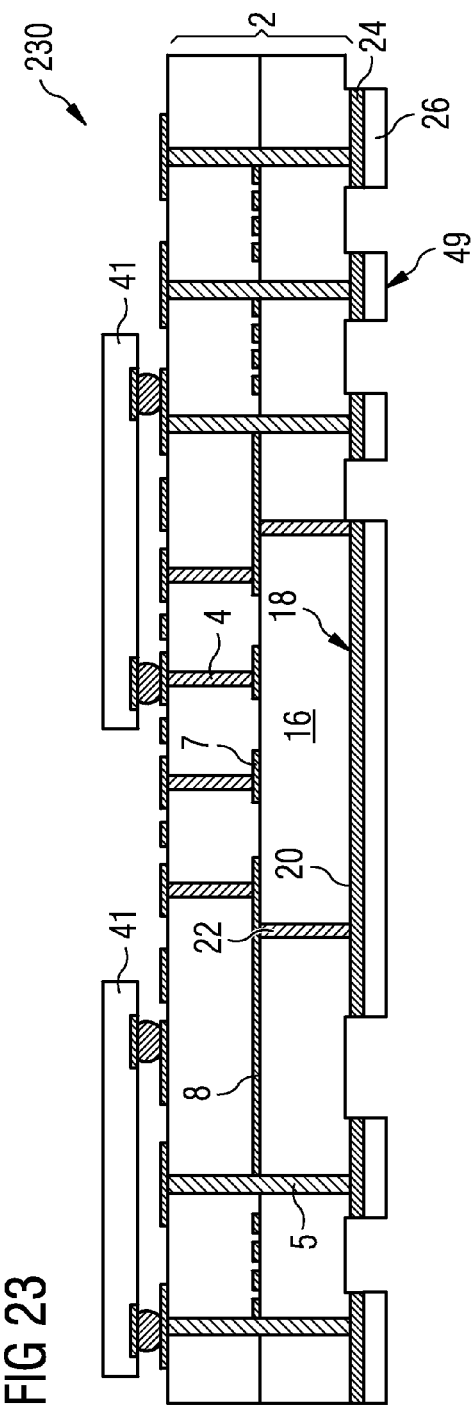
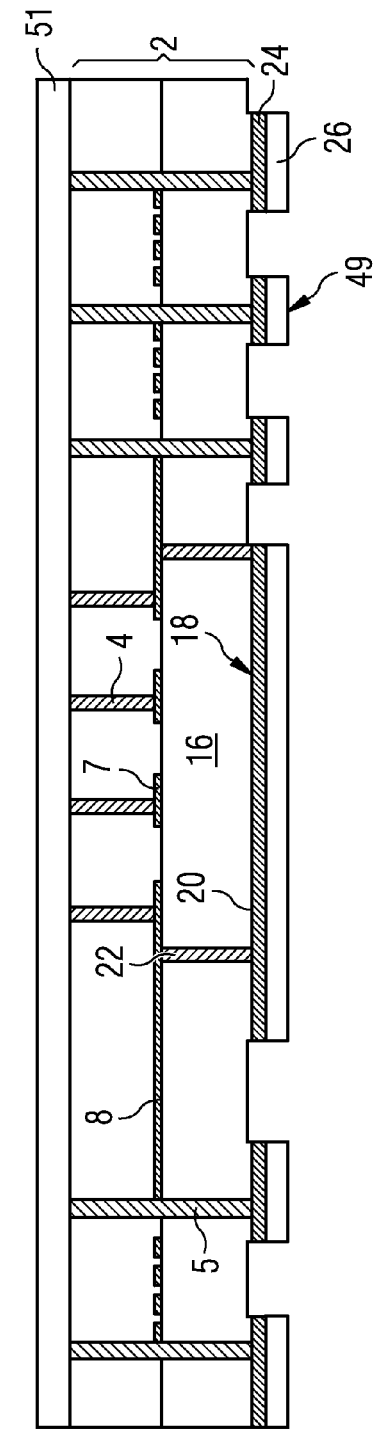
FIG 23
FIG 24

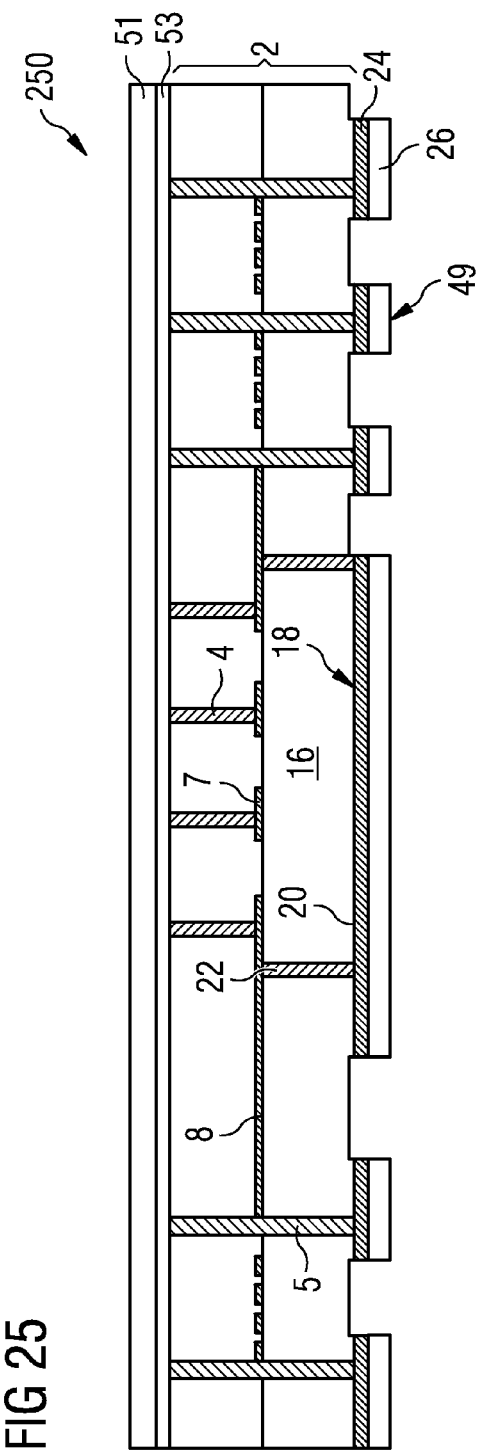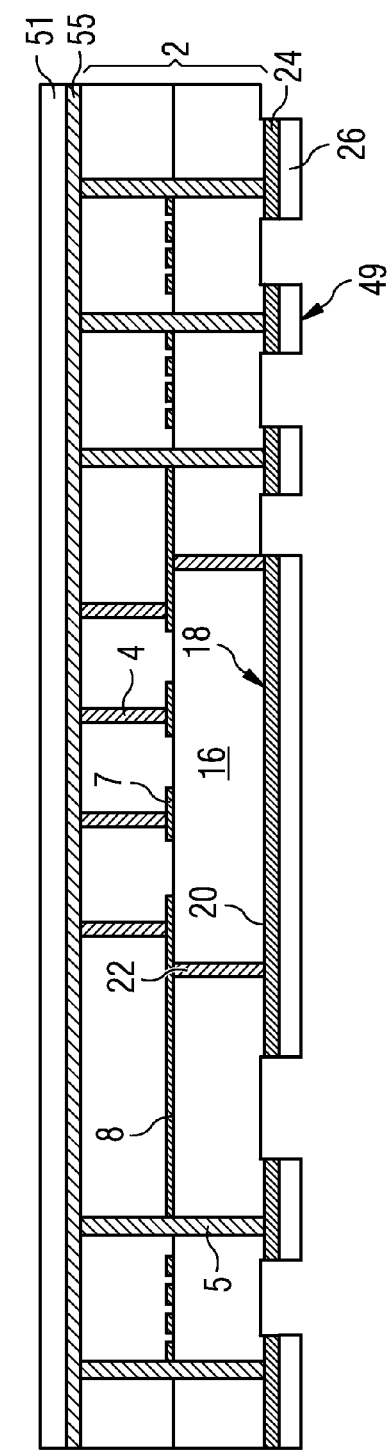

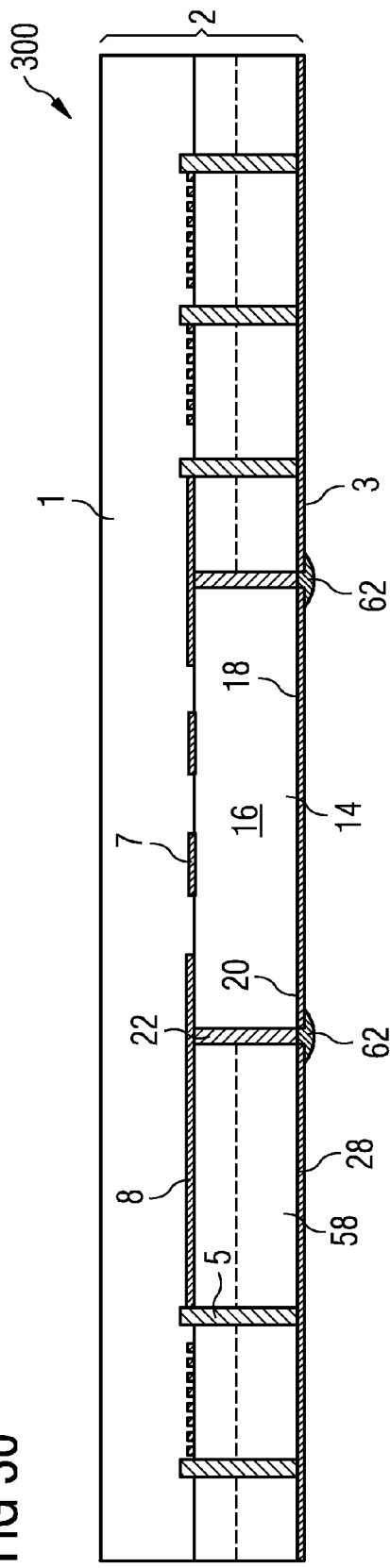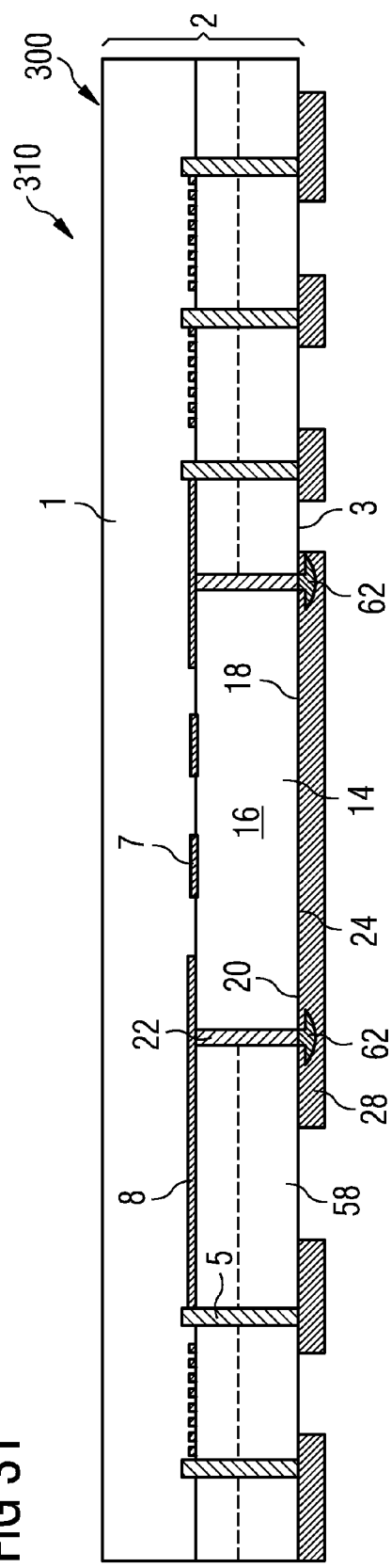

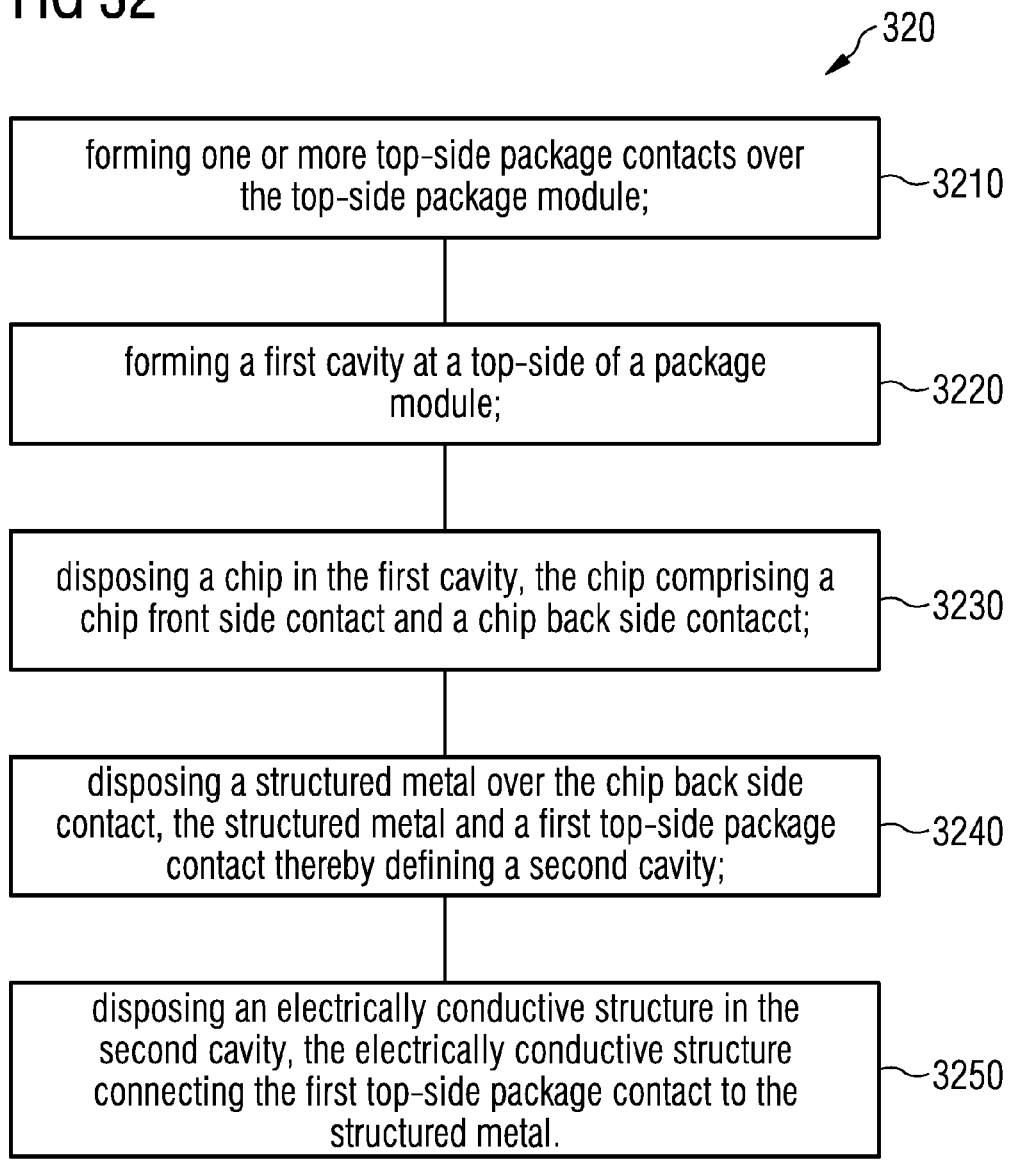

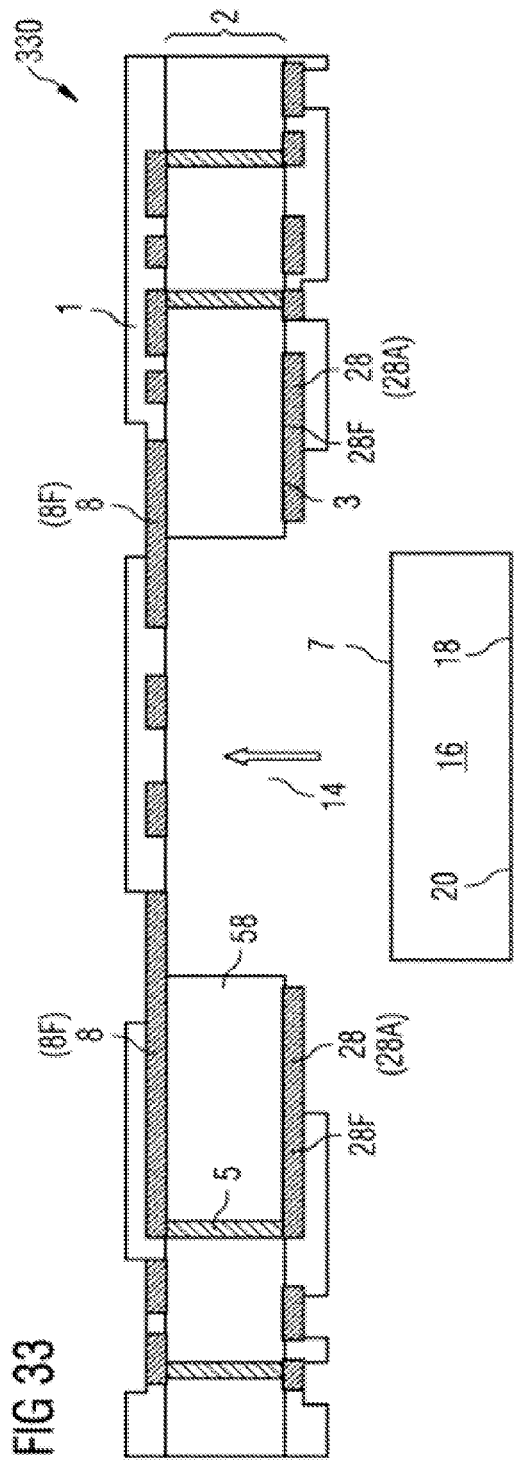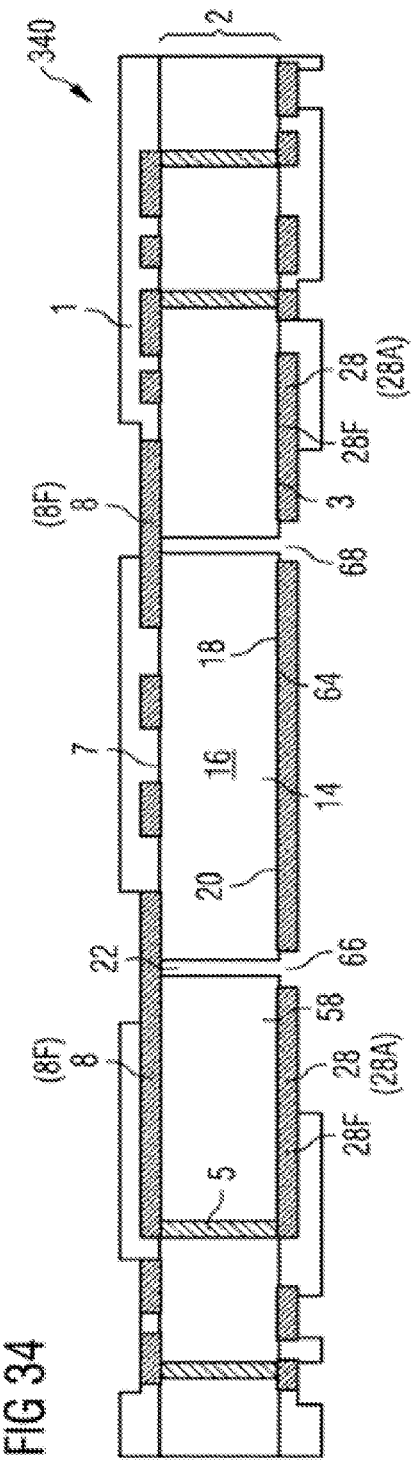

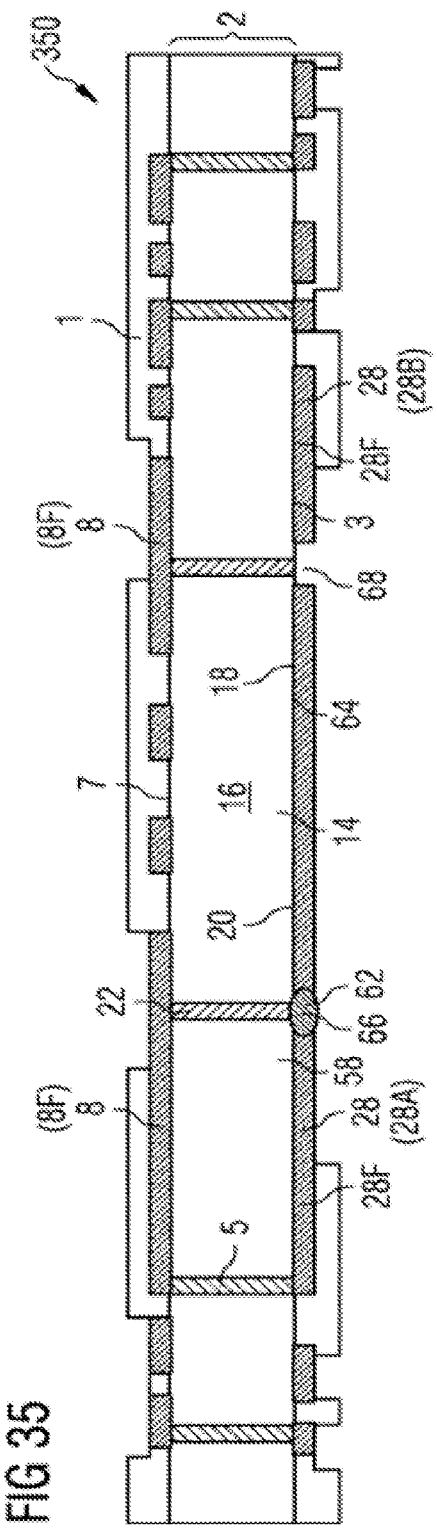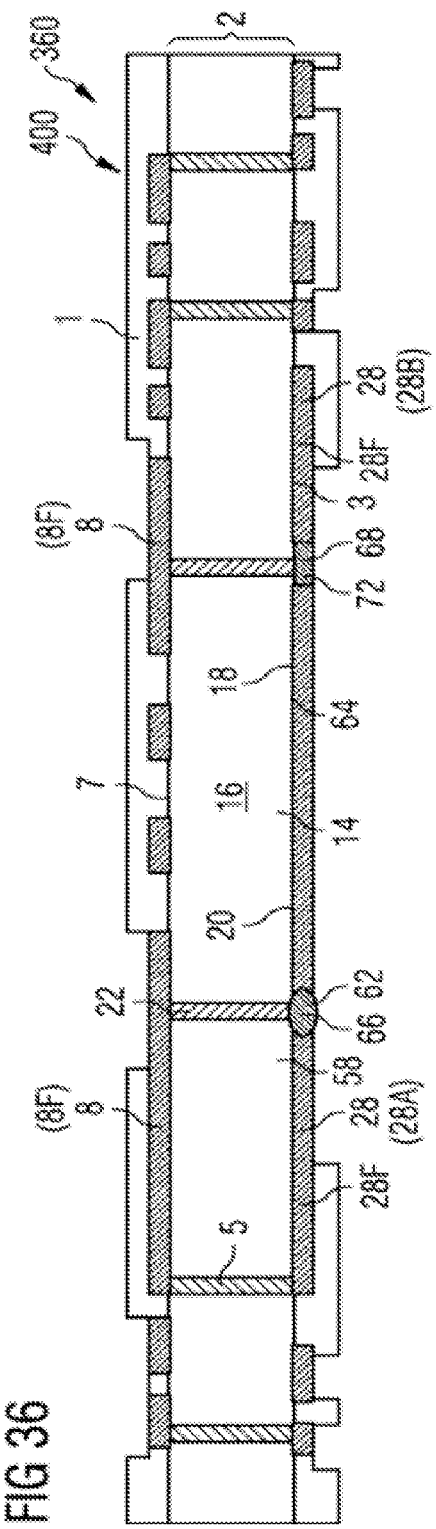

INTEGRATED CIRCUIT PACKAGE AND A METHOD FOR MANUFACTURING AN INTEGRATED CIRCUIT PACKAGE

CROSS-REFERENCE TO RELATED APPLICATIONS

The present application is a continuation-in-part application of a continuation-in-part application Ser. No. 13/326,527 filed Dec. 15, 2011, of U.S. application Ser. No. 13/103,124 filed May 9, 2011, both now pending, the entirety of which is herein incorporated by reference.

TECHNICAL FIELD

Various embodiments relate generally to an integrated circuit package and a method for manufacturing an integrated circuit package.

BACKGROUND

Integrated circuit (IC) chips are usually incorporated into a package. Such packaging provides, for example, physical and environmental protection as well as heat dissipation. Moreover, packaged chips typically provide electrical leads to allow integration with further components.

Several IC packaging techniques have been developed. One such technique, for example is described in, Lee et al., "Embedded Actives and Discrete Passives in a Cavity Within Build-up Layers," U.S. patent application Ser. No. 11/494,259 filed on Jul. 27, 2006 and published as US 2007/0025092 A1 on Feb. 1, 2007, the content of which is hereby incorporated by reference in its entirety. Lee et al. discloses, inter alia, a so-called chip-last approach.

In contrast to a chip-first or chip-middle process, a chip-last approach embeds a given chip after all build-up layer processes are finished. The advantages of this approach are now well known, however, chip-last packaging is not thought to be appropriate for all chip types. For example, for ICs having a back-side contact, and for those chips whose operating parameters call for dissipation of higher quantities of heat, such as power chips and high-performance logic chips.

SUMMARY

Various embodiments provide an integrated circuit package including a package module including one or more circuit interconnections formed in a carrier, wherein at least one top-side package contact is formed over the top-side of the package module and electrically connected to at least one circuit interconnection of the one or more circuit interconnections and wherein a cavity is formed at the top-side of the package module; a chip disposed in the cavity, the chip including at least one chip front side contact and at least one chip back side contact, wherein the at least one chip front side contact is electrically connected to at least one further circuit interconnection of the one or more circuit interconnections; an electrically conductive structure connecting the at least one top-side package contact to the chip back side contact; and a metallic layer formed over the electrically conductive structure and on the chip back side contact.

BRIEF DESCRIPTION OF THE DRAWINGS

To further clarify the above and other advantages and features of the present invention, a more particular description of the invention will be rendered by reference to specific embodiments thereof that are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIGS. 1-3 show an exemplary process flow, from a cross-sectional view, for fabricating an exemplary package module;

FIG. 4 illustrates a cross-sectional view of an exemplary integrated circuit package with a chip having back-side contact;

FIG. 5 illustrates a cross-sectional view of an exemplary integrated circuit package with a top layer;

FIG. 6 illustrates a cross-sectional view of an exemplary integrated circuit package with a heat sink and/or metal foil layer;

FIGS. 7-9 illustrate cross-sectional views of exemplary integrated circuit packages as in FIGS. 4-6 with a top-side package contact;

FIG. 10-12 illustrate cross-sectional views of exemplary integrated circuit packages as in FIGS. 4-6 with top-side pads and/or isolating middle layers;

FIG. 13 illustrates a cross-sectional view of an exemplary integrated circuit package with multiple chips;

FIG. 14 illustrates a cross-sectional view of an exemplary integrated circuit package with an isolated heat spreading layer;

FIG. 15 illustrates a cross-sectional view of an exemplary integrated circuit package with a chip having through silicon vias;

FIGS. 16 and 17 illustrate cross-sectional views of exemplary integrated circuit packages with a backside of nano metal or solder on plated, sputtered, or structured metal, and an optional isolated heat sink and/or metal foil layer thereon;

FIGS. 18-21 show another exemplary process flow, from a cross-sectional view, for fabricating an exemplary package module;

FIG. 22 illustrates a cross-sectional view of an exemplary integrated circuit package in a reverse mount configuration; and FIGS. 23-26 illustrate various further embodiments of a cross-sectional view of an exemplary integrated circuit package in a reverse mount configuration.

FIGS. 29-31 illustrate a method for manufacturing an integrated circuit package according to an embodiment.

FIG. 32 illustrates a method for manufacturing an integrated circuit package according to an embodiment.

FIGS. 33-35 illustrate a method for manufacturing an integrated circuit package according to an embodiment.

FIG. 36 illustrates an integrated circuit package according to an embodiment.

DETAILED DESCRIPTION

Figure 9:
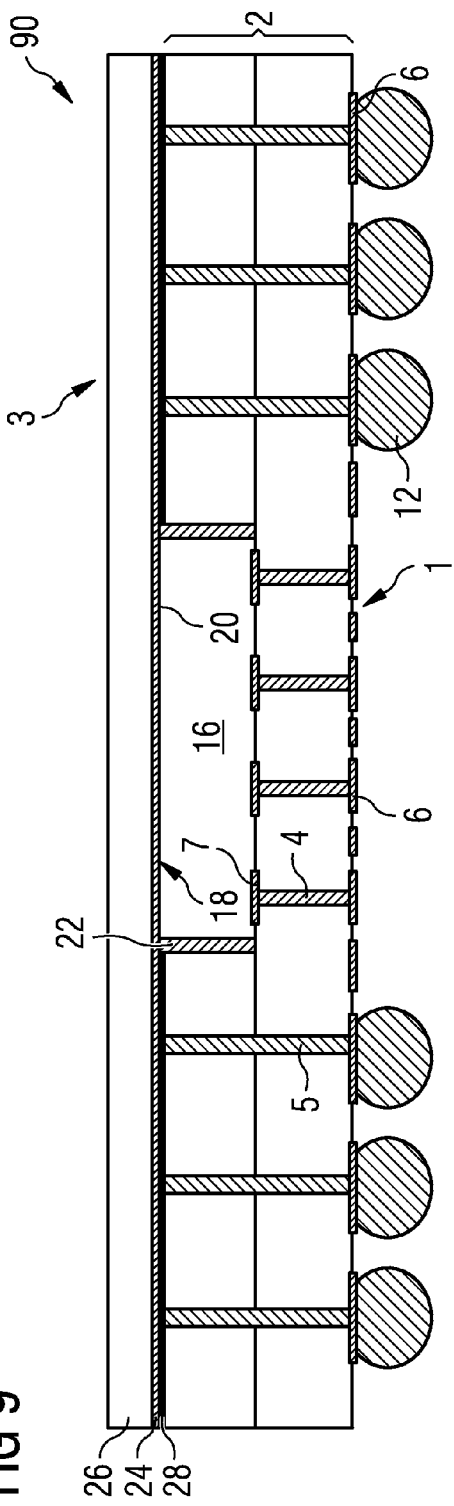

Reference will now be made to figures wherein like structures will be provided with like reference designations. It is understood that the drawings are diagrammatic and schematic representations of exemplary embodiments of the invention, and are not limiting of the present invention nor are they necessarily drawn to scale.

FIGS. 1-3 show an exemplary process flow, from a cross-sectional view, for fabricating an exemplary package module 10. The exemplary process flow, or method, for integrated circuit packaging may be implemented as follows.

In FIG. 1, package module 2 may begin to be formed from successive build-up layers (a laminate) which define a top-side 3, a bottom-side 1 and circuit interconnections 4. Such circuit interconnections 4 may be vias formed in the manner described below with regard to vias 5 and/or include, for example, embedded passive components such as circuit wiring, capacitors, resistors, and/or inductors. For example, it may include layered routing 8, formed, for example of structured metal. Circuit interconnections 4 may be made using standard high density interconnections technology, and may have bottom-side pads 6 electrically coupled thereto provided on bottom-side 1 of package module 2. Further, in addition to traditional layering techniques, the build-up layering process may also include depositing thin film on an ultra-thinned core.

Vias 5 may also be formed in package module 2 by, for example, mechanical numerical control (NC) drilling, laser drilling, formations of successive build-up layers, or by other means known in the art. After via holes are formed, vias 5 may be metalized by electroless plating or electrolytic plating, for example.

Solder balls 12 may be provided in electrical connection with vias 5 and/or circuit interconnections 4 providing a contact terminus on bottom-side 1 of package module 2 of integrated circuit package 10 for connection, such as to a printed circuit (PC) board.

In FIG. 2, further successive build-up layers are added to the formation of package module 2. This process results in embedding passive components into package module 2. In this manner all layers of the package may contain structured metal for routing of, for example, signals, power, and ground.

In FIG. 3 a cavity 14 is formed on a top-side 3 of package module 2. Laser drilling, amongst other techniques, may be used to form cavity 14. Once cavity 14 is formed, connection pads, if not already present, may be added by conventional methods to circuit interconnections 4 exposed in cavity 14. As discussed below with reference to FIG. 4, cavity 14 should preferably be formed such that a chip 16 is capable of being disposed in cavity 14.

FIG. 4 illustrates a cross-sectional view of an exemplary integrated circuit package 40 with chip 16 having a back-side contact. Such chips include, for example, IGBTs, through which current flows vertically (i.e. from back to front through the silicon substrate) from the back-side contact of the chip to its front-side. Chip 16, having a set of forward contacts 7, and depending upon the type of chip, having back-side contact 20 on back-side 18 is disposed into cavity 14 such that forward contacts 7 are electrically connected to one or more of circuit interconnections 4 of package module 2. Back-side 18 of chip 16 is generally metalized during wafer processing. Thus further processing of chips during packaging, as described herein, is understood as being distinct processes and distinct resulting layers. Forward contacts 7 of chip 16 may be formed during the chip's normal fabrication process, and may be electrically connected through circuit interconnections 4 to bottom-side 1 of package module 2. Gaps between chip 16 and package module 2, if present, may be filled such as with a fill material 22. Fill material 22 may also be used as an underfill material (not shown), thereby embedding a chip.

Other configurations may include chip 16 being a high-performance logic chip. Such a high-performance logic chip may include, for example, an Intel® Core™, an AMD® Phenom II™, or an IBM® Z196™. Another configuration may include chip 16 being a thinned chip.

FIG. 5 illustrates a cross-sectional view of an exemplary integrated circuit package 50 with a top layer. A top layer 24 is provided, such as by plating (as, for example, after surface treatment of the laminate material forming package module 2) onto at least a portion of top-side 3 of package module 2 as discussed above with respect to integrated circuit package 10 (FIGS. 1-3), and at least a portion of back-side 18 of chip 16. Alternatively, top layer can be sputtered metal, plated following sputtering, a metallic layer formed by application of dirty plasma, or ink jetted over some or all of the chip and/or top-side 3 of package module 2. Typically, top layer 24 may be coupled to back-side 18 of chip 16 and covers at least a part of chip 16 and the top-side of package module 2. Advantageously, top layer 24 may be a metallic layer such as copper for instance or a structured metal. Depending on the application and type of chip used, the coupling between chip 16 and top layer 24 may establish a thermal and/or electrical connection with back-side 18 of chip 16.

In an implementation wherein top layer 24 establishes an electrical connection with back-side 18 of chip 16, top layer 24 may advantageously be positioned in electrical contact with one or more vias 5, thereby establishing an electrical connection from back-side 18 of chip 16 to bottom-side 1 of package module 2. In particular, for chips having a back-side contact 20, electrical connection between contact 20 and bottom-side 1 is thus established.

In use, integrated circuit package 50 may be connected to outside circuitry such as through a PC board (not shown). Electrical current provided to chip 16 through the electrical connections established at bottom-side 1 of package module 2 flows to forward contacts of chip 16 through circuit interconnections 4 and to back-side contact 20 through vias 5. For example, chip 16 may be a so-called "power chip", or a power electronics chip having a low-ohmic back-side contact. Such chips may operate with current flowing vertically through the chip, such as between back-sides 18 toward forward contacts 7. In such a case, back-side contact 20 is typically a low-ohmic contact, which may be formed on chip 16 during or after fabrication of chip 16. In such a case, electrical contact between low ohmic back-side contact 20 and vias 5 allow the basic integrated circuit package 10 described above in FIGS. 1-3 to function with power chips having low-ohmic back-side contacts through the addition of an electrically conductive top layer 24 when used in the configuration of circuit package 50 of FIG. 5.

In addition to the provision of access to a back-side electrical connection in integrated circuit package 50, use of power chips in high-performance applications may also generate additional heat when compared with chips having lower current handling capability or current requirements. Careful selection of material used in top layer 24 may help, owing to the characteristics of the material selected to diffuse heat in addition to its ability to conduct electrical current. Therefore, materials such as copper, copper alloys, silver, nickel, and similar materials with a high thermal and/or electrical conductivity are particularly suitable for use as top layer 24. When used for heat spreading in this manner, good thermal coupling between chip 16 and top layer 24 is desirable. Further heat dissipating efficiency can be obtained by maximizing the surface area of top layer 24, and the percentage of that area exposed to ambient air for example, and/or by increasing the thickness of top layer 24 to increase thermal mass and/or ensure efficient spreading of heat throughout top layer 24 by conduction.

Where heat generated during operation of chip 16 is not adequately dissipated by integrated circuit package 50, additional thermal structures may be added without affecting the ability of top layer 24 to function as an electrical connection to a back-side contact, such as back-side contact 20 of chip 16. Accordingly, and as described below with reference, for example, to FIG. 6, top layer 24 may be configured to act as both an electrical connector and as a thermal heat spreader, resulting in circuit package 60, having superior thermal characteristics in addition to the electrical features of integrated circuit package 50.

Although some chips such as high performance logic chips may not have a low ohmic back-side contact 20, such high performance logic chips may, like power chips, generate high temperatures beyond those readily dissipated by the chip or by its packaging. In such a case, top layer 24 can be selected from materials such as copper that provide good heat spreading characteristics. Thus, top layer 24 may be made of any material that furthers the above described functionality, in particular materials that have high electrical and/or thermal conductive properties, as the particular chip 16 may require. Therefore, whether or not electrical contact to the back-side of a chip is needed, the present package configuration provides a structure and method consistent with a chip-last approach to packaging that can accommodate chips having a wide range of design requirements.

If top layer 24 is composed of metal it may be implemented, for example, with any suitable type of plated metal, sputtered metal, structured metal, metal foil or combination thereof and moreover may be attached, for example, by gluing or soldering top layer 24 to chip 16, such as in the case of metal foil, and to the top-side of package module 2, such as by an adhesive. Other methods of application may also be used, such as in a nano paste, through deposition with dirty plasma, or by sputtering or solder. Depending on the configuration, one or more of the above can be used in combination, for example taking into consideration the affinity of materials to each other.

Dirty plasma is known as a plasma with supporting gas which has particle-sized metal powder suspended therein. This method is particularly advantageous in forming a layer having sufficient material thickness and minimal additional processing to obtain top layer 24 after chip 16 has been placed within package module 2.

If top layer 24 is glued, it might be desirable that the glue possess high electrical and/or thermal conductive properties in order to facilitate the advantages of electrical and/or thermal connectivity with top layer 24 as heretofore described. Examples of such glue include, for example, Tanaka® TS-333™ and Lord® MT-815™. By contrast, where insulation (either thermal and/or electrical) is desired, different material would be selected for this purpose.

In other configurations, in which top layer 24 may be attached with solder, soldering might include eutectic soldering. Another configuration might include nano metal as top layer 24. In such configurations, metal itself may naturally adhere as a part of its application as top layer 24 on back-side 18 of chip 16 and to the top-side of package module 2.

Vias 5 may terminate at solder balls 12 which in turn may be used to connect to outside circuitry such as, for example, a printed circuit board. This allows low ohmic back-side contact 20 to be connected to bottom-side 1 of package module 2 and therefrom to circuitry outside package 40. Further vias 5 may be beneficial, for example, in logic chips that require a ground contact, or for radio frequency (RF) shielding purposes. Similarly, vias 5 may be beneficial, for example, in grounding power chips.

In order to balance the electrical load in, for example, high performance chips, multiple vias 5 may be connected to top layer 24 to split the current across multiple vias 5. In another application, vias 5, when connected to low ohmic back-side contact 34 as described, may act as part of a feedback loop.

As noted above, top layer 24 may function as a heat spreader instead of, or in addition to being part of the electrical connection between back-side contact 20 and bottom-side 1 of package module 2. As the surface area of top layer 24 typically exceeds the area of back-side 18 of chip 16, a significant increase in heat dissipation from chip 16 will occur through heat spreading in top layer 24 depending on the material used and configuration (such as thickness) thereof. However, where additional heat dissipation is required additional thermal structures can be provided.

FIG. 6 illustrates a cross-sectional view of an exemplary integrated circuit package 60 with a heat sink and/or metal foil layer 26. As illustrated, top layer 24 may be directly attached to heat sink and/or metal foil layer 26 providing thermal contact therewith. Heat sink and/or metal foil layer 26 may be attached, for example, mechanically or adhered to top layer 24 with nano paste, glue, dirty plasma (such as in combination with plating and solder), or solder (such as after sputter and plating of 5 μm of copper), thermal compound or eutectic soldering.

In the instance where 26 functions as a heat sink, it may be designed, for example, with straight fins or pin fins and be constructed of copper or aluminum or other materials with high thermal conductivity to increase its efficiency. Moreover, such a heat sink is preferably well ventilated by ambient air. Aided by the heat spreading properties of top layer 24, such as when top layer 24 is formed of copper, the efficiency of the heat sink is improved.

In the instance where 26 is a metal foil layer, it may be coupled onto top layer 60, and constructed of, for example, copper. Metal foil layer 26 may serve the same purpose as a heat sink, namely, metal foil layer may serve as a means for dissipating heat and/or may also help with high current loads, such as where layers 24 and 26 function together to provide electrical contact to back-side contact 20 of chip 16.

Other heat sink methods may also be used for heat sink and/or metal foil layer 26. For example, an active fan may blow cool external air across a set of heat sink fins. In another example, the heat sink may be liquid cooled with an apparatus circulating liquid.

FIGS. 7-9 illustrate cross-sectional views of exemplary integrated circuit packages (70, 80, and 90 respectively) as in FIGS. 4-6 with a top-side package contact 28. In this alternative approach top-side 3 has a contact applied thereto thus forming a top-side package contact 28. Similar to FIGS. 5 and 6, a top layer 24 may be attached directly to top-side package contact 28 and back-side contact 20. Further, alternatively or in addition to, a heat sink and/or a metal foil layer 26 may be attached to the integrated circuit package.

Figure 10:
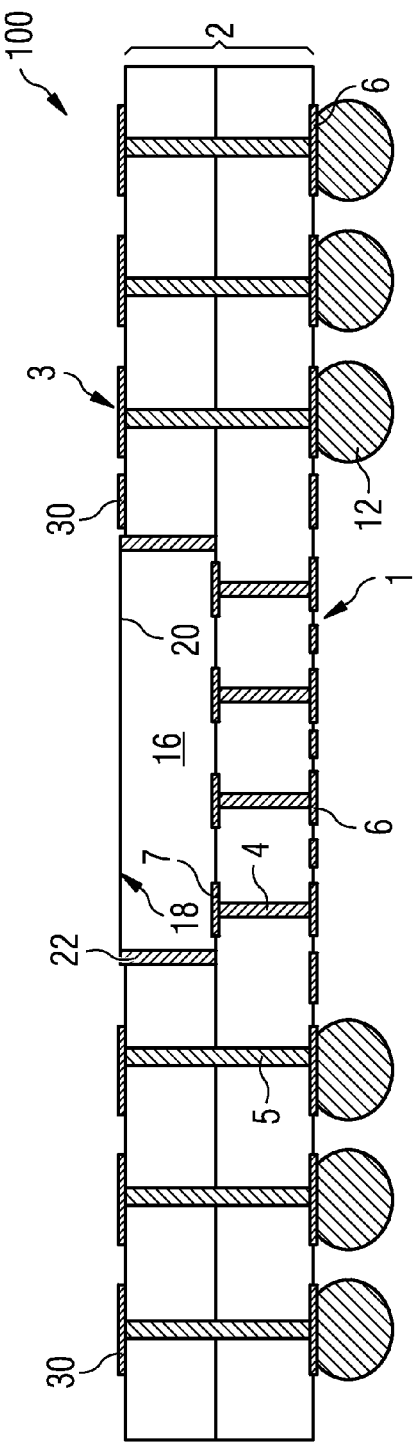

FIGS. 10-12 illustrate cross-sectional views of exemplary integrated circuit packages (100, 110, and 120 respectively) as in FIGS. 4-6 with top-side pads 30 and/or isolating middle layers 32. Top-side pads 30 may be formed on top-side 3 of package module 2. Top layer 24 may be coupled to back-side 18 of chip 16 and top-side of package module 2 by way of isolating middle layer 32. Isolating middle layer may insulate, for example, a subset of vias 5, from direct electrical contact with top layer 24. Such an arrangement may be useful, for example, in chip stacking arrangements, or where insulated vias 35 are already connected (such as by various configurations of layered routing as disclosed above in connection with FIGS. 1-3) to another device or are to be reserved to establish other connections not related to top layer 24. Moreover, there may be metal patterning thereon, including, for example on a portion of top layer 24, isolating middle layer 32, connection pads of circuit interconnections 4, forward contacts 7, vias 5, and/or isolated vias 35. Such metal patterning may, for example, be employed for electrical routing therebetween.

FIG. 13 illustrates a cross-sectional view of an exemplary integrated circuit package 130 with multiple chips 36, 34. Combinations of the above embodiments may also be formed. For example, power chip 36 may be packaged, according to the chip-last approach as described herein, alongside logic chip 34 with the same chip-last technique. That is, two or more cavities may be formed within package module 2. Similarly, two or more chips as described above may be disposed within the cavities and physically, electrically, and/or thermally connected as heretofore described. In a logic chip plus power chip configuration, a portion of top layer 24 may be used, for example, for electrical routing between logic chip 34 and low power chip 36. Alternatively, electrical routing may take place within package module 2. As a further alternative, integrated circuit package 130 may include isolating middle layer 32 which may isolate chip 34 from physical, electrical, and/or thermal contact with top layer 24.

FIG. 14 illustrates a cross-sectional view of an exemplary integrated circuit package 140 with an isolated heat spreading layer 38. Isolated heat spreading layer 38 is electrically isolating and thermally conductive. AlN filled glues may be applied, for example, to achieve the electrically isolating yet thermally conductive functionality. Such a configuration may be advantageous where it is desirable to electrically isolate portions of top layer 24 from upper layers such as, for example, heat sink and/or metal foil layer 26.

FIG. 15 illustrates a cross-sectional view of an exemplary integrated circuit package 150 with a chip having through silicon vias (TSVs) 37. TSVs 37 vertically pass through chip 16 and thus provide electrical connection on back-side. TSVs may help to increase performance by facilitating a higher three-dimensional density, and/or lowering contact resistance to back-side 18. TSVs 37 may optionally be directly coupled to forward contacts 7 of chip 16, or to the internal circuitry of chip 16 (not shown). TSVs may also be used in multiple chip configurations such as exemplary integrated circuit package 130 described above with reference to FIG. 13.

FIGS. 16 and 17 illustrate cross-sectional views of exemplary integrated circuit packages (160 and 170 respectively) with a backside of nano metal or solder on plated, sputtered, or structured metal, and an optional isolated heat sink and/or metal foil layer 26 thereon. In particular, FIGS. 16 and 17 depict structured recesses 39 structured in top layer 24, top-side package contact 28, and heat sink and/or metal foil layer 26. Structured recesses 39 are functional for example, as part of the electrical routing on top-side 18 of package module 2. Such routing, for example, could be used to electrically connect stacked chip 41. Some methods of applying printed metal structures include, for example, ink jetting, or so called screen or stencil printing. While both of the methods may be used to apply structured metal, screen printing is generally less expensive while ink jetting results in a thinner and finer pitched application.

FIGS. 18-21 show another exemplary process flow, from a cross-sectional view, for fabricating an exemplary package module. The exemplary process flow, or method, for integrated circuit packaging may be implemented as follows.

In FIG. 18, package module 2 is formed in a manner similar to the process flow described in FIGS. 1-3 and its accompanying description above. In particular, package-part 180 includes package module 2 and is fabricated from successive build-up layers (a laminate) which define a top-side 3, a bottom-side 1 and circuit interconnections 4. Such circuit interconnections 4 may be vias formed in the manner described above with regard to vias 5 and/or include, for example, embedded passive components such as circuit wiring, capacitors, resistors, and/or inductors. For example, it may include layered routing 8, formed, for example of structured metal. Circuit interconnections 4 may be made using standard high density interconnections technology, and may have bottom-side pads 6 electrically coupled thereto provided on bottom-side 1 of package module 2. Further, in addition to traditional layering techniques, the build-up layering process may also include depositing thin film on an ultra-thinned core. Cavity 14 is formed on top-side 3 of package module 2. Solder balls 12 may be provided in electrical connection with vias 5 and/or circuit interconnections 4 providing a contact terminus on bottom-side 1 of package module 2 of integrated circuit package 10 for connection, such as to a printed circuit (PC) board.

FIG. 19 shows metallic layer 45 with photo structured surface 43. Photo structure surface 43 may be used to provide a structure for metallic layer 45, and may use several means to achieve the goal of providing a structure for metallic layer 45. For example, if photo structure surface 43 is a permanent resist, it is laminated onto metallic layer 45, imaged with appropriate exposure equipment, developed and then stripped from metallic layer 45. Alternatively, Laser Direct Structuring (LDS) may be used to remove the desired portion of photo structure surface 43 from metallic layer 45. A further alternative might include spray coating metallic layer 45 with polymide (PI) as photo structured surface 43. After PI is applied as photo structured surface 43 to metallic layer 45, it is allowed to dry and then exposed, developed and stripped. Using PI as photo structured surface 43 may provide stability during subsequent high temperature processing. As another alternative, photo structure surface 43 may be omitted or substituted with a printed solder stop on metallic layer 45.

The structure provided by photo structure surface 43 is useful for accurate processing as described below with respect to FIG. 20. Exposure of photo structured surface 43 is preferably micrometer precise. Once the desired exposure and processing of photo structured surface 43 has occurred, a small frame will be left on metallic layer 45. Small frame 42 is shown from the cross-sectional view as chip area 44 being free of photo structure surface 43 while the area surrounding chip area 44 has photo structure surface 43 present. Such a small frame, for example, may be on the order of 100 micrometers. The small frame should preferably match the size and attachment location of chip 16.

FIG. 20 shows chip 16 having a front-side with forward contacts 7 and back-side 18. Chip 16 is, for example, a power electronics chip and/or a high-performance logic chip. Back-side 18 of chip 16 may comprise a low ohmic contact. FIG. 20 further depicts metallic layer 45 having been attached to back-side 18 of chip 16 to form chip-part 190. Metallic layer 45 may be, for example, a metal foil layer and may have thermally conductive properties facilitating heat spreading. Furthermore, metallic layer 45, for example, might contain structured recesses, and may also be attached to a heat sink to facilitate further heat spreading.

The attachment of chip 16 to metallic layer 45 may involve a high temperature process such as diffusion soldering which are conducted at temperatures that may exceed the tolerance of package-part 180. Diffusion soldering is typically performed at relatively high temperatures in order to thin the solder. Diffusion soldering, for example, generally exceeds 200 degrees Celsius. The diffusion soldering between chip 16 and metallic layer 45 is preferably performed remotely and prior to disposing chip 16 into cavity 14. Thus package module 2 may not need to be constructed to withstand the relatively higher temperatures generally needed to perform diffusion soldering or other high temperature processes.

Photo structure surface 43 may be useful in correctly positioning chip 16 onto metallic layer 45 during attachment. Photo structure surface 43 may be particularly useful during high temperature processes such as diffusion soldering where solder flow and evaporation are relatively unpredictable. By forming photo structure surface 43 into a small frame as described above with respect to FIG. 19, the solder flow and evaporation may be restricted to the attachment location of chip 16. Thus photo structured surface 43 may be used for precise soldering onto metallic layer 45. Drilled hole 47 may also be made through metallic layer 45 in order to provide means for optical alignment in integrating chip-part 190 with package-part 180 as shown in FIG. 21.

In FIG. 21, chip-part 190 is integrated with package-part 180 such that chip 16 is disposed in cavity 14. Chip 16 is disposed in cavity 14 such that forward contacts 7 are electrically connected to one or more of circuit interconnections 4 of package module 2, and metallic layer 45 is coupled to top-side 3 of package module 2. Metallic layer 45 may coupled to top-side 3 of package module 2 through various means available to provide physical and/or electrical coupling. X-ray imaging may be used in order to correctly align chip-part 190 with respect to package-part 180 during attachment, since the copper vias should generally be visible even through metallic layer 45. Metallic layer 45 may be coupled to top-side 3 of package module 2, for example, using a glue or nano paste. In this way integrated circuit package 200 may be configured, for example, so that current can flow vertically between a low ohmic contact on backside 18 of chip 16 and the set of forward contacts of the chip. Further, a low ohmic contact on back-side 18 of chip 16 may be electrically connected by way of metallic layer 45, for example, to one or more vias formed in the package module. Thus current and/or signaling can be distributed as needed throughout integrated circuit package 200 as previously described above.

FIG. 22 illustrates a cross-sectional view of an exemplary integrated circuit package in a reverse mount configuration. Package module 220 may be constructed in accordance with the above description, and also as described with reference to FIG. 21, but rather than having the active side of chip 16 facing a connected PCB and back-side 18 of chip 16 facing away from the connected PCB, package module 220 is reversed such that the active side of chip 16 faces away from a connected PCB and back-side of chip 16 faces toward the connected PCB. Thus when connected to a PCB, a direct connection from back-side 18 of chip 16 is made to the connected PCB, and forward contacts 7 of chip 16 are connected by way of vias to the connected PCB. Both sets of connection paths, the direct connection from back-side 18 of chip 16 and forward contacts 7 of chip 16 connected by way of vias, may be configured into two routing layers connected through package connectors 49.

Package connectors 49 may be coupled to external circuitry, for example a PCB, by processing package module 220 an organic solder protect (OSP) process and then soldering package module 220 onto the PCB. Package connector 49 can be employed in all the disclosed embodiments as a substitute for solder balls 12. Further all of the disclosed embodiments can be configured such that the metallic layer connecting the back-side 18 of chip 16 is structured such that the package module is capable of being mounted by package connectors 49. As an example, package connector 49 can be employed for instance with the embodiment described with reference to FIG. 16. In such a configuration, FIG. 16 would be mounted in a reverse configuration such that back-side 18 of chip 16 is mountable facing down towards external circuitry such as a PCB. Solder balls 12 may not be needed in such a configuration, and as such might be removed.

FIGS. 23-26 illustrate various further embodiments of a cross-sectional view of an exemplary integrated circuit package in a reverse mount configuration. In accordance with the description of FIGS. 17 and 22, FIG. 23 shows stacked chips 41 connected and integral to package module 230. As described above with regards to FIG. 22, rather than having the active side of chip 16 facing a connected PCB and back-side 18 of chip 16 facing away from the connected PCB, package module 230 is reversed such that the active side of chip 16 faces away from a connected PCB and back-side of chip 16 faces toward the connected PCB. Thus when connected to a PCB, a direct connection from back-side 18 of chip 16 is made to the connected PCB, and forward contacts 7 of chip 16 are connected by way of vias to the connected PCB. Both sets of connection paths, the direct connection from back-side 18 of chip 16 and forward contacts 7 of chip 16 connected by way of vias, may be configured into two routing layers connected through package connectors 49.

In accordance with above embodiments, FIG. 24 shows package module 240 in a reverse mount configuration. Further, package module 240 includes heat spreader 51, thus effectuating heat spreading on both sides of package module 240. That is, heat sink and/or metal foil layer 26 may provide heat spreading on the contact side of package module 240, while heat spreader 51 provides heat spreading on the other side of package module 240. Heat spreader 51 may be at least partly electrically isolated.

In accordance with above embodiments, FIG. 25 likewise shows package module 250 in a reverse mount configuration with heat spreader 51. As compared to FIG. 24, heat spreader 51 in FIG. 25 is attached to package module 2 by nano paste 53. Similarly, FIG. 26 shows package module 260 in a reverse mount configuration with heat spreader 51 connected to package module 2 by thermal glue 55.

A person skilled in the art will recognize that combinations of the above exemplary embodiments may be formed. For example, any of integrated circuit packages 10, 40, 50, 60, 70, 80, 90, 100, 110, 120, 130, 140, 150, 160, 170 and 210 be configured in a reverse mount configuration as shown in FIGS. 22-26. As another example, any of integrated circuit packages 10, 40, 50, 60, 70, 80, 90, 100, 110, 120, 130, 140, 150, 160 and 170 may implement the process flow shown in FIGS. 18-21, in particular, chip 16 may be diffusion soldered to metallic layer 45 such that the metallic layer 45 covers at least a part of back-side 18 of chip 16.

In one implementation, in order to provide a package module appropriate for a wide range of chip types, including power chips, chips having a back-side contact, and high performance logic chips, an integrated circuit packaging method includes fabricating a package module from successive build-up layers which define circuit interconnections, forming a cavity on a top-side of the package module, attaching a metalized back-side of a chip onto a metallic layer, the chip having a front-side with at least one forward contact, disposing the chip in the cavity such that the set of forward contacts are electrically connected to one or more of the circuit interconnections of the package module, and coupling the metallic layer that is attached to the chip onto the package module.

Similarly, in another implementation, an integrated circuit package includes a package module with a cavity formed therein. The package module may be formed as a laminate from successive build-up layers which define a top-side, a bottom-side and circuit interconnections therebetween. Following a chip-last approach, the cavity may be formed on the top-side of the package module. Typically, the formation of the cavity exposes one or more of the circuit interconnections, for example at the bottom of the cavity. A chip has a front-side with a set of forward contacts and a metalized back-side that is attached to a metallic layer such that the metallic layer covers at least a part of the back-side of the chip, and the top-side of the package module may be disposed in the cavity such that the set of forward contacts are electrically connected to one or more of the circuit interconnections of the package module. The chip is disposed in the cavity such that the set of forward contact is electrically connected to one or more of the circuit interconnections of the package module, and the metallic layer covers at least a part of the top-side of the package module.

One or more of the following features may be included or combined in the above implementations. Attaching the metalized back-side of the chip onto the metallic layer may be done with a high temperature process. Attaching the metalized back-side of the chip onto the metallic layer may be done with a diffusion soldering process. The metallic layer may be a metal foil layer. The back-side of the chip may be a low ohmic contact. Current may flow vertically between the low ohmic contact and the set of forward contacts of the chip. The chip may be a power electronics chip. The low ohmic contact may be electrically connected, for example through electrical connection with the metallic layer, to one or more vias formed in the package module. The chip may be a high-performance logic chip. The metallic layer may have thermally conductive properties facilitating heat spreading. The metallic layer may be attached to a heat sink. The chip may include through silicon vias. All or a portion of the metallic layer may be coupled to the back-side of the chip and the top-side of the package module by way of an isolating middle layer. The chip may be mounted in a reverse mount configuration. A reverse mount configuration is where the metalized back-side of the chip faces towards the printed circuit board and front-side of the chip faces away from the printed circuit board.

Figure 27:
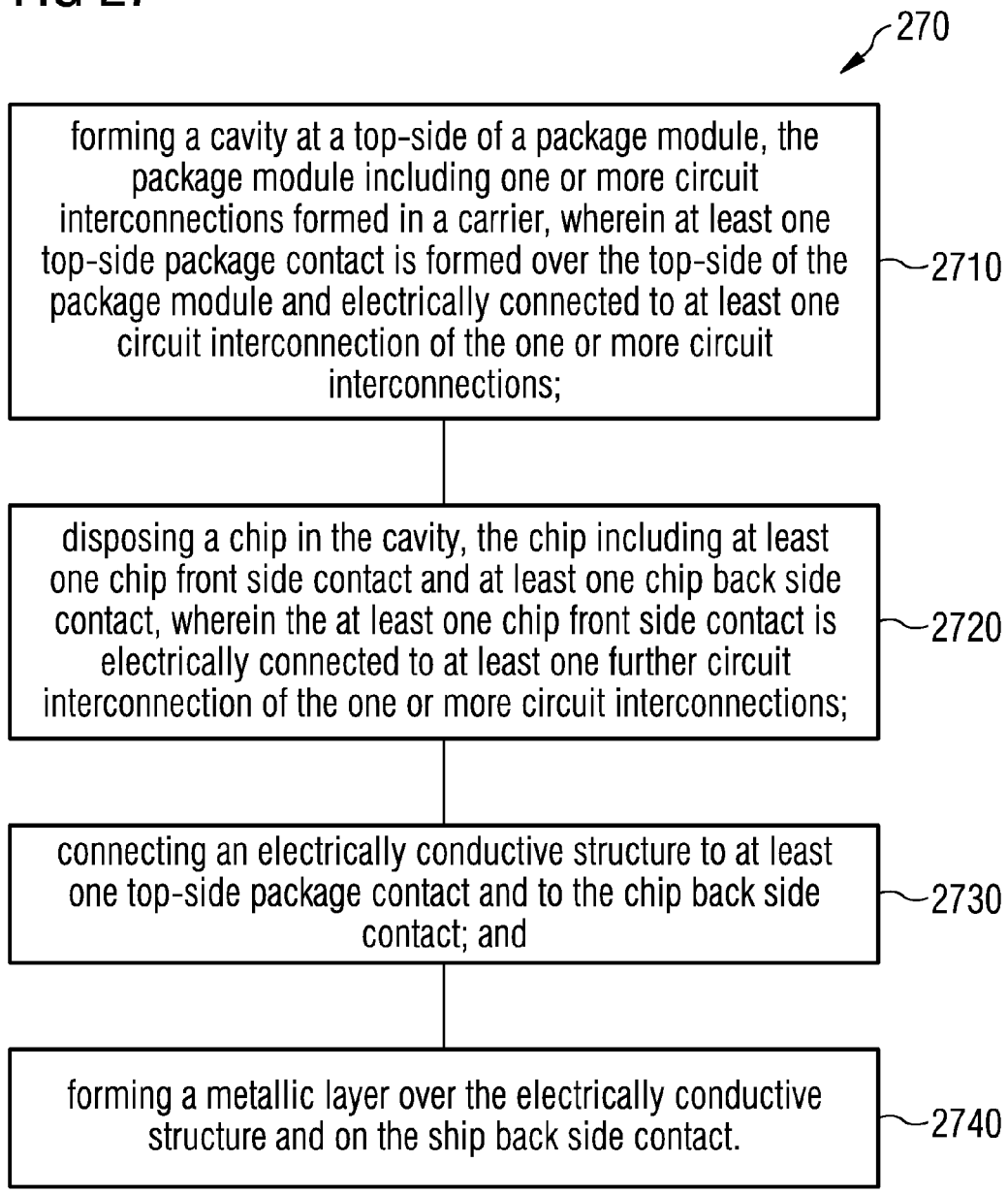
FIG. 27 illustrates a method for manufacturing an integrated circuit package according to an embodiment.

FIG. 27 shows a method 270 for manufacturing an integrated circuit package according to an embodiment. Method 270 may include: forming a cavity at a top-side of a package module, the package module including one or more circuit interconnections formed in a carrier, wherein at least one top-side package contact is formed over the top-side of the package module and electrically connected to at least one circuit interconnection of the one or more circuit interconnections (in 2710); disposing a chip in the cavity, the chip including at least one chip front side contact and at least one chip back side contact, wherein the at least one chip front side contact is electrically connected to at least one further circuit interconnection of the one or more circuit interconnections (in 2720); connecting an electrically conductive structure to at least one top-side package contact and to the chip back side contact (in 2730); and forming a metallic layer over the electrically conductive structure and on the chip back side contact (in 2740).

Figure 28:
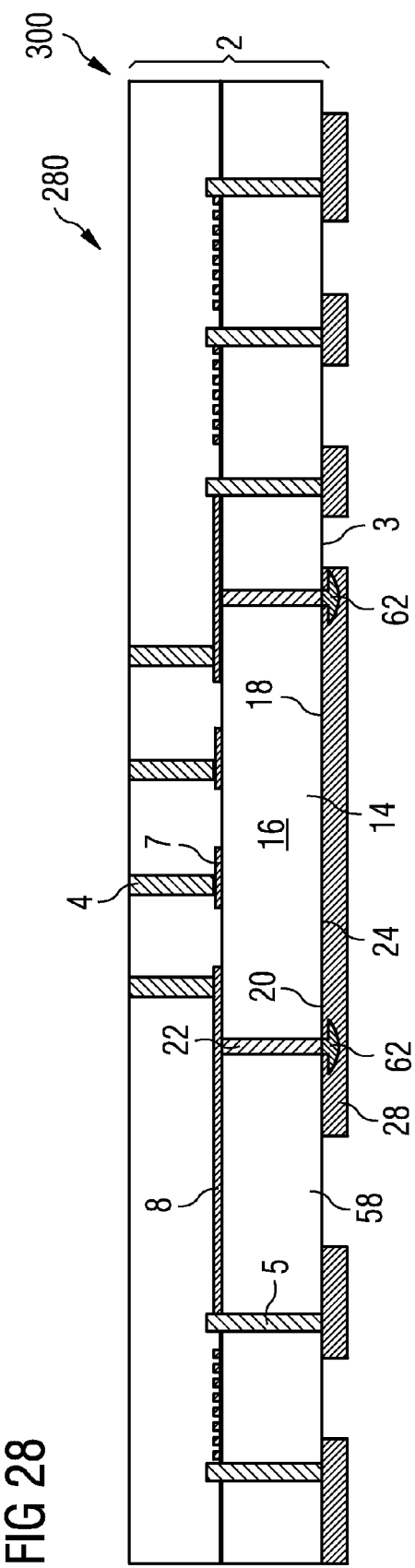
FIG. 28 illustrates an integrated circuit package according to an embodiment.

FIG. 28 shows integrated circuit package 300 according to an embodiment. Integrated circuit package 300 may include a package module 2. Package module 2 may include any of package modules already described above. Integrated circuit package 300 may include package module 2 including one or more circuit interconnections 4, 5 formed in a carrier 58, wherein at least one top-side package contact 28 is formed over the top-side 3 of the package module 2 and electrically connected to at least one circuit interconnection 5 of the one or more circuit interconnections 4, 5 and wherein a cavity 14 is formed at the top-side 3 of the package module 2; a chip 16 disposed in the cavity 14, the chip 16 including at least one chip front side contact 7 and at least one chip back side contact 20, wherein the at least one chip front side contact 7 is electrically connected to at least one further circuit interconnection 4, of the one or more circuit interconnections 4, 5; an electrically conductive structure 62 connecting the at least one top-side package contact 28 to the chip back side contact 20; and a metallic layer 24 formed over the electrically conductive structure 62 and on the chip back side contact 20.

Figure 29:
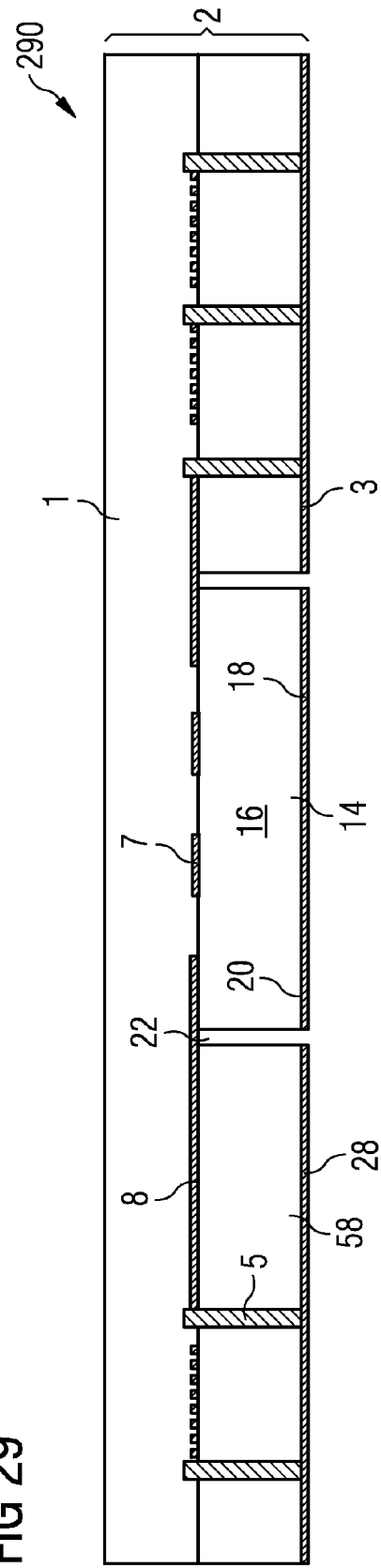

As shown in FIGS. 28 to 30, package module 2 may include a carrier 58, which may include successive build-up layers including laminate, as described above. The one or more circuit interconnections 4, 5 may be formed through carrier 58 and be electrically insulated from each other by carrier 58. The at least one circuit interconnection 5 of the one or more circuit interconnections 4, 5 may be provided between the top-side 3 of the package module 2 and a bottom side 1 of the package module 2. The at least one further circuit interconnection 4 of the one or more circuit interconnections 4, 5 may be provided between the cavity 14 and a bottom side 1 of the package module 2. The at least one chip front side contact 7 may be electrically connected to the at least one further circuit interconnection 4 of the one or more circuit interconnections 4, 5 provided to the cavity 14. The at least one top-side package contact 28 may include a structured top-side pad 30 electrically connected to at least one circuit interconnection 5 of the one or more circuit interconnections 4, 5.

The integrated circuit package 300 may further include electrically insulating fill material 22 formed in gaps between chip 16 and the package module 2. Electrically insulating fill material 22 may be formed in gaps between the chip 16 and sidewalls of the cavity 14. Electrically insulating fill material 22 may include a non-electrically conductive glue.

As shown in FIG. 30, the electrically conductive structure 62 may be formed over the electrically insulating fill material 22. The electrically conductive structure 62 may include an electrically conductive glue or ink, which may be printed. Without electrically conductive structure 62, chip back side contact 20 may be electrically disconnected from at least one top-side package contact 28. Therefore, a metallic layer 24 would not be able to be plated, e.g. electroplated, over chip back side contact 20 and at least one top-side package contact 28, without first an electrically conductive connection between chip back side contact 20 and at least one top-side package contact 28. According to an embodiment, an extra seed layer may be deposited over the chip back side contact 20 and the at least one top-side package contact 28 so that a continuous metallic layer 24 may be formed over chip back side contact 20 and the at least one top-side package contact 28. However, this may require additional photostructuring processes and/or the additional deposition of the extra seed layer. Therefore, instead, electrically conductive structure 62 may be formed between chip 16 and package module 2, and may connect, e.g. electrically connect the chip back-side contact 20 to the at least one top-side package contact 28. Electrically conductive structure 62 may be formed at least partially in gaps between the chip 16 and sidewalls of the cavity 14.

As shown in FIG. 31, top layer 24 also referred to as metallic layer 24 may then be formed over the at least one top-side package contact 28. Metallic layer 24 may be formed, e.g. electroplated, directly on the electrically conductive structure 62 and directly on the chip back side contact 20. Therefore, chip back-side contact 20 and at least one top-side package contact 28 may function as a seed layer for the plating of metallic layer 24. Metallic layer 24 may be formed, e.g. electroplated, directly on the at least one top-side package contact 28. Metallic layer 24 may therefore include a plated continuous metallic layer which may electrically connect chip back side contact 20 and the at least one top-side package contact 28. No additional extra seed layer will be needed for the plating to take place. Subsequently, a heat sink material and/or metal foil layer 26 as described previously may be formed over the metallic layer 24.

It may be understood that the formation of metallic layer 24, may be carried out for example by plating, e.g. semi-additive plating (SAP), directly on the electrically conductive structure 62, directly on the chip back side contact 20 and directly on at least one top-side package contact 28. It may be understood that a photomask may be used and/or disposed over top side 3 of package module 2 so that patterned plating of metallic layer 24 may occur only in areas not covered by the photomask. Alternatively, metallic layer 24 may be non-selectively plated in areas which may include being directly plated on the electrically conductive structure 62, directly plated on the chip back side contact 20 and directly plated on at least one top-side package contact 28. Portions of metallic layer 24 in areas not intending to be covered by metallic layer 24 may then be removed, e.g. using etching.

Integrated circuit package 300 may include any of integrated circuit packages 10, 40, 50, 60, 70, 80, 90, 100, 110, 120, 130, 140, 150, 160, 170 and 210 already described above.

FIG. 32 shows a method 320 for manufacturing an integrated circuit package according to an embodiment. Method 320 may include forming one or more top-side package contacts over the top-side of the package module (in 3210); forming a first cavity at a top-side of a package module (in 3220); disposing a chip in the first cavity, the chip comprising a chip front side contact and a chip back side contact (in 3230); disposing a structured metal over the chip back side contact, the structured metal and a first top-side package contact thereby defining a trench (3240); and disposing an electrically conductive structure in the trench, the electrically conductive structure connecting the first top-side package contact to the structured metal (3250).

FIGS. 33 to 36 show various implementations for manufacturing an integrated circuit package, e.g. integrated circuit package 400, according to various embodiments. Integrated circuit package 400 may be suitable for power devices, and may provide thick metal structures for higher performance.

As shown in FIG. 33, package module 2 may be prepared. For example, vias 5 may be filled with electrically conductive materials. One or more top-side package contacts 28A, 28B may be formed over top-side 3 of package module 2. The one or more top-side package contacts may be formed by depositing one or more structured metal foils 28F over top-side 3 of package module 2 to form top-side package contacts 28A, 28B. Furthermore, one or more routing layers 8 may be formed over bottom-side 1 of package module 2. The one or more routing layers 8 may be formed by depositing one or more structured metal foils 8F over bottom-side 1 of package module 2. Metal foils 28F, ie. the top-side package contacts, may have a thickness of greater than about 30 μm, e.g. greater than about 40 μm, e.g. greater than about 50 μm.

Subsequently, first cavity 14 may be formed at top side 3 of package module 2. After forming first cavity 14 at top-side 3 of package module 2, die attach materials and/or adhesives may be deposited in first cavity 14. Chip 16 may be disposed in first cavity 14, and adhered to package module 2 via the die attach materials and/or adhesives. Electrically insulating fill material 22 may subsequently be formed in gaps between chip 16 and sidewalls of cavity 14.

As shown in FIG. 34, subsequently, structured metal 64 may be formed over chip back side contact 20. Structured metal 64 may include e.g. structured metal foils, and may have a thickness of greater than about 30 μm, e.g. greater than about 40 μm, e.g. greater than about 50 μm. Optionally, one or more layers of solder stop material may be deposited over structured metal 64. The formation of structured metal 64 over chip back side contact 20, may be carried out such that structured metal 64 may be separated from top-side package contacts 28 by a gap. For example, structured metal 64 and first top-side package contact 28A may be separated by a gap and structured metal 64 and first top-side package contact 28A may thereby define a trench 66. Furthermore, structured metal 64 and second top-side package contact 28B may be separated by a gap and structured metal 64 and second top-side package contact 28B may thereby define a further trench 68. Trench 66 and further trench 68 may be situated over electrically insulating fill material 22. According to some embodiments, trench 66 and further trench 68 may be joined to each other. As an example, trench 66 and further trench 68 may form part of a single continuous gap between chip 16 and package module 2. For example, trench 66 and further trench 68 may form part of a single cavity around a perimeter of chip 16.

Subsequently, as shown in FIG. 35, electrically conductive structure 62 may be deposited or disposed in trench 66. Electrically conductive structure 62 may connect first top-side package contact 28A to structured metal 64. Electrically conductive structure 62 may be formed over electrically insulating fill material 22. Metal layer 72 may be deposited or disposed in further trench 68 by via plating. Metal layer 72 may include a low ohmic material, e.g. copper. With via plating, it may be possible to avoid having to plate large areas of structured metal 64, and top-side 3 of package module 2. It may even be possible to avoid having to plate over structured metal 64 at all. Via plating may allow the sidewalls of further trench 68 to be plated with metal, without necessarily filling the entire further trench 68. In this way, sidewalls of further trench 68 may be covered with metal layer 72, and further trench 68 may optionally be partially or fully filled with metal layer 72. As a result, back-side 18 of chip 16 may be at least partially surrounded by metal layer 72. Metal layer 72 may connect second top-side package contact 28B to structured metal 64.

FIG. 36 shows integrated circuit package 400 according to an embodiment. Integrated circuit package 400 may include: one or more circuit interconnections 5 formed in carrier 58, and a first top-side package contact, e.g. 28A, 28B formed over top-side 3 of package module 2. Package module 2 may further include first cavity 14 formed at top-side 3 of package module 2. Integrated circuit package 400 may further include chip 16 disposed in first cavity 14, wherein chip 16 may include chip front side contact 7 and chip back side contact 20. Integrated circuit package 400 may further include structured metal 64 disposed over chip back side contact 20. Structured metal 64 and top-side package contact 28A may define trench 66, wherein electrically conductive structure 62 may be disposed in trench 66 and wherein electrically conductive structure 62 may connect first top-side package contact 28A to structured metal 64.

Electrically insulating fill material 22 may be formed in gaps between chip 16 and package module 2. Electrically conductive structure 62 may be formed over electrically insulating fill material 22 and electrically conductive structure 62 may include an electrically conductive glue or ink. Second top-side package contact 28B of package module 2 and structured metal 64 may define further trench 68. Metal layer 72 may be disposed in further trench 68. Metal layer 72 may include copper.

Various embodiments provide an integrated circuit package including a package module including one or more circuit interconnections formed in a carrier, wherein at least one top-side package contact is formed over the top-side of the package module and electrically connected to at least one circuit interconnection of the one or more circuit interconnections and wherein a cavity is formed at the top-side of the package module; a chip disposed in the cavity, the chip including at least one chip front side contact and at least one chip back side contact, wherein the at least one chip front side contact is electrically connected to at least one further circuit interconnection of the one or more circuit interconnections; an electrically conductive structure connecting the at least one top-side package contact to the chip back side contact; and a metallic layer formed over the electrically conductive structure and on the chip back side contact.

According to an embodiment, the package module includes a carrier including successive build-up layers including laminate. According to an embodiment, the one or more circuit interconnections are formed through the carrier and electrically insulated from each other by the carrier. According to an embodiment, the at least one circuit interconnection of the one or more circuit interconnections is provided between the top-side of the package module and a bottom side of the package module. According to an embodiment, the at least one further circuit interconnection of the one or more circuit interconnections is provided between the cavity and a bottom side of the package module.

According to an embodiment, the at least one chip front side contact is electrically connected to the at least one further circuit interconnection of the one or more circuit interconnections provided to the cavity. According to an embodiment, the at least one top-side package contact includes a structured top-side pad electrically connected to at least one circuit interconnection of the one or more circuit interconnections. According to an embodiment, the integrated circuit package further includes electrically insulating fill material formed in gaps between the chip and the package module. According to an embodiment, the integrated circuit package further includes electrically insulating fill material formed in gaps between the chip and sidewalls of the cavity. According to an embodiment, the electrically conductive structure is formed over the electrically insulating fill material. According to an embodiment, the electrically conductive structure includes an electrically conductive glue or ink. According to an embodiment, the electrically conductive structure electrically connects the chip back-side contact to the at least one top-side package contact. According to an embodiment, the metallic layer is formed over the at least one top-side package contact. According to an embodiment, the metallic layer is formed directly on the electrically conductive structure and directly on the chip back side contact. According to an embodiment, the metallic layer is formed directly on the at least one top-side package contact. According to an embodiment, the metallic layer includes a plated metallic layer. According to an embodiment, the integrated circuit package further includes a heat sink material formed over the metallic layer.

Various embodiments provide a method for manufacturing an integrated circuit package, the method including: forming a cavity at a top-side of a package module, the package module including one or more circuit interconnections formed in a carrier, wherein at least one top-side package contact is formed over the top-side of the package module and electrically connected to at least one circuit interconnection of the one or more circuit interconnections; disposing a chip in the cavity, the chip including at least one chip front side contact and at least one chip back side contact, wherein the at least one chip front side contact is electrically connected to at least one further circuit interconnection of the one or more circuit interconnections; connecting an electrically conductive structure to at least one top-side package contact and to the chip back side contact; and forming a metallic layer over the electrically conductive structure and on the chip back side contact.

According to an embodiment, the method further includes forming electrically insulating fill material in gaps between the chip and sidewalls of the cavity, wherein the electrically conductive structure is formed over the electrically insulating fill material. According to an embodiment, forming a metallic layer over the electrically conductive structure and on the chip back side contact includes forming the metallic layer directly on the electrically conductive structure and directly on the chip back side contact. According to an embodiment, the method further includes forming the metallic layer directly on the at least one top-side package contact. According to an embodiment, forming the metallic layer includes plating the metallic layer.

Various embodiments provide an integrated circuit package including a package module including one or more circuit interconnections formed in a carrier, and a first top-side package contact formed over the top-side of the package module, the package module further including a first cavity formed at the top-side of the package module; a chip disposed in the first cavity, the chip including a chip front side contact and a chip back side contact; a structured metal disposed over the chip back side contact, the structured metal and the top-side package contact defining a trench; and an electrically conductive structure disposed in the trench and connecting the first top-side package contact to the structured metal.

According to an embodiment, the package module includes a carrier including successive build-up layers including laminate. According to an embodiment, the integrate circuit package further includes electrically insulating fill material formed in gaps between the chip and the package module. According to an embodiment, the electrically conductive structure is formed over the electrically insulating fill material. According to an embodiment, the electrically conductive structure includes an electrically conductive glue or ink. According to an embodiment, the top-side package contact and the structured metal each have a thickness greater than about 30 µm. According to an embodiment, a second top-side package contact of the package module and the structured metal define a further trench. According to an embodiment, the integrated circuit package further includes a metal layer disposed in the further trench. According to an embodiment, the metal layer includes copper.

Various embodiments provide a method for manufacturing an integrated circuit package, the method including: forming one or more top-side package contacts over the top-side of the package module; forming a first cavity at a top-side of a package module; disposing a chip in the first cavity, the chip including a chip front side contact and a chip back side contact; disposing a structured metal over the chip back side contact, the structured metal and a first top-side package contact thereby defining a trench; and disposing an electrically conductive structure in the trench, the electrically conductive structure connecting the first top-side package contact to the structured metal.

According to an embodiment, the method further includes forming electrically insulating fill material in gaps between the chip and sidewalls of the cavity; and forming the electrically conductive structure over the electrically insulating fill material. According to an embodiment, disposing a structured metal over the chip back side contact includes disposing a structured metal over the chip back side contact to define a further trench between a second top-side package contact of the package module and the structured metal. According to an embodiment, the method further includes disposing a metal layer in the further trench by via plating. According to an embodiment, forming the one or more top-side package contacts includes depositing one or more structured metal foils over the top-side of the package module to form the one or more top-side package contacts.

The present invention may be embodied in other specific forms without departing from its spirit or essential characteristics. The described embodiments are to be considered in all respects only as illustrative, not restrictive. The scope of the invention is, therefore, indicated by the appended claims rather than by the foregoing description. All changes that come within the meaning and range of equivalency of the claims are to be embraced within their scope.

What is claimed is:

1. An integrated circuit package comprising
 a package module comprising one or more circuit interconnections formed in a carrier, and a first top-side package contact formed over the top-side of the package module, the package module further comprising a first cavity formed at the top-side of the package module;
 a chip disposed in the first cavity, the chip comprising a chip front side contact and a chip back side contact;
 a structured metal disposed over the chip back side contact, the structured metal and the top-side package contact defining a trench; and
 an electrically conductive structure disposed in the trench and connecting the first top-side package contact to the structured metal.

2. The integrated circuit package according to claim 1, wherein the package module comprises a carrier comprising successive build-up layers comprising laminate.

3. The integrated circuit package according to claim 1, further comprising
 electrically insulating fill material formed in gaps between the chip and the package module.

4. The integrated circuit package according to claim 3, wherein the electrically conductive structure is formed over the electrically insulating fill material.

5. The integrated circuit package according to claim 4, wherein the electrically conductive structure comprises an electrically conductive glue or ink.

6. The integrated circuit package according to claim 1, wherein the top-side package contact and the structured metal each have a thickness greater than about 30 µm.

7. The integrated circuit package according to claim 1, wherein a second top-side package contact of the package module and the structured metal define a further trench.

8. The integrated circuit package according to claim 7, further comprising a metal layer disposed in the further trench.

9. The integrated circuit package according to claim 8, wherein the metal layer comprises copper.

10. A method for manufacturing an integrated circuit package, the method comprising:
 forming one or more top-side package contacts over the top-side of the package module;
 forming a first cavity at a top-side of a package module;
 disposing a chip in the first cavity, the chip comprising a chip front side contact and a chip back side contact;
 disposing a structured metal over the chip back side contact, the structured metal and a first top-side package contact thereby defining a trench; and
 disposing an electrically conductive structure in the trench, the electrically conductive structure connecting the first top-side package contact to the structured metal.

11. The method according to claim 10, further comprising
 forming electrically insulating fill material in gaps between the chip and sidewalls of the cavity; and
 forming the electrically conductive structure over the electrically insulating fill material.

12. The method according to claim 10, wherein disposing a structured metal over the chip back side contact comprises disposing a structured metal over the chip back side contact to define a further trench between a second top-side package contact of the package module and the structured metal.

13. The method according to claim 10, further comprising disposing a further electrically conductive structure in the further trench by via plating.

14. The method according to claim 10, wherein forming the one or more top-side package contacts comprises depositing one or more structured metal foils over the top-side of the package module to form the one or more top-side package contacts.

* * * * *